(12) United States Patent
Park

(10) Patent No.: US 7,821,009 B2
(45) Date of Patent: Oct. 26, 2010

(54) SIGNAL LINE, A THIN FILM TRANSISTOR ARRAY PANEL COMPRISING THE SIGNAL LINE, AND METHOD FOR MANUFACTURING THE SAME

(75) Inventor: Hong-Sick Park, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 11/239,795

(22) Filed: Sep. 29, 2005

(65) Prior Publication Data
US 2006/0118788 A1 Jun. 8, 2006

(30) Foreign Application Priority Data
Dec. 7, 2004 (KR) .................. 10-2004-0102374

(51) Int. Cl.
*H01L 27/14* (2006.01)
*H01L 29/43* (2006.01)

(52) U.S. Cl. .................................. 257/72; 257/59

(58) Field of Classification Search ............ 257/72, 257/52, 57, 59, 347, E27.111, E29.151
See application file for complete search history.

(56) References Cited

U.S. PATENT DOCUMENTS

| | | | |
|---|---|---|---|
| 5,777,702 A * | 7/1998 | Wakagi et al. ............ | 349/47 |
| 6,576,925 B2 * | 6/2003 | Tsujimura et al. ........ | 257/59 |
| 2001/0030717 A1 * | 10/2001 | Kaneko et al. ............ | 349/43 |
| 2003/0164290 A1 * | 9/2003 | Chen et al. ............... | 204/192.29 |
| 2004/0007705 A1 * | 1/2004 | Song et al. ............... | 257/72 |
| 2004/0195573 A1 * | 10/2004 | Kim ......................... | 257/72 |
| 2004/0232443 A1 | 11/2004 | Cho et al. | |
| 2006/0209529 A1 * | 9/2006 | Son et al. ................. | 362/84 |

FOREIGN PATENT DOCUMENTS

| | | |
|---|---|---|
| JP | 08-248442 | 9/1996 |
| JP | 09059787 A * | 3/1997 |
| JP | 2002-250936 | 9/2002 |
| JP | 2003-036037 | 2/2003 |
| JP | 2003-323131 A | 11/2003 |
| KR | 1020020079155 | 10/2002 |
| KR | 1020030024160 | 3/2003 |
| KR | 1020030084163 | 11/2003 |

(Continued)

OTHER PUBLICATIONS

English translation of JP 09-059787.*

(Continued)

*Primary Examiner*—Anh Phung
*Assistant Examiner*—Allison P Bernstein
(74) *Attorney, Agent, or Firm*—Innovation Counsel LLP

(57) ABSTRACT

A thin film transistor array panel includes an insulating substrate, a gate line formed on the insulating substrate, a gate insulating layer formed on the gate line, a drain electrode and a data line having a source electrode formed on the gate insulating layer wherein the drain electrode faces the source electrode with a gap therebetween, and a pixel electrode connected to the drain electrode. At least one of the gate line, the data line, and the drain electrode includes a first conductive layer made of a conductive oxide and a second conductive layer of Ag that is deposited adjacent to the first conductive layer.

10 Claims, 35 Drawing Sheets

FOREIGN PATENT DOCUMENTS

| | | |
|---|---|---|
| KR | 1020040025606 | 3/2004 |
| KR | 1020040036642 | 4/2004 |

OTHER PUBLICATIONS

English Language Abstract, JP Patent First Publication No. 2003-036037, Feb. 7, 2003, 1 page.

English Language Abstract, JP Patent First Publication No. 2002-250936, Sep. 6, 2002, 1 page.

English Language Abstract, KR Patent First Publication No. 1020030024160, Mar. 26, 2003, 1 page.

English Language Abstract, KR Patent First Publication No. 1020020079155, Oct. 19, 2002, 1 page.

English Language Abstract, KR Patent First Publication No. 1020030084163, Nov. 1, 2003, 1 page.

English Language Abstract, KR Patent First Publication No. 1020040025606, Mar. 24, 2004, 1 page.

English Language Abstract, KR Patent First Publication No. 1020040036642, 1 page.

English Language Abstract, JP Patent First Publication No. 08-248442, Sep. 27, 1996, 1 page.

\* cited by examiner

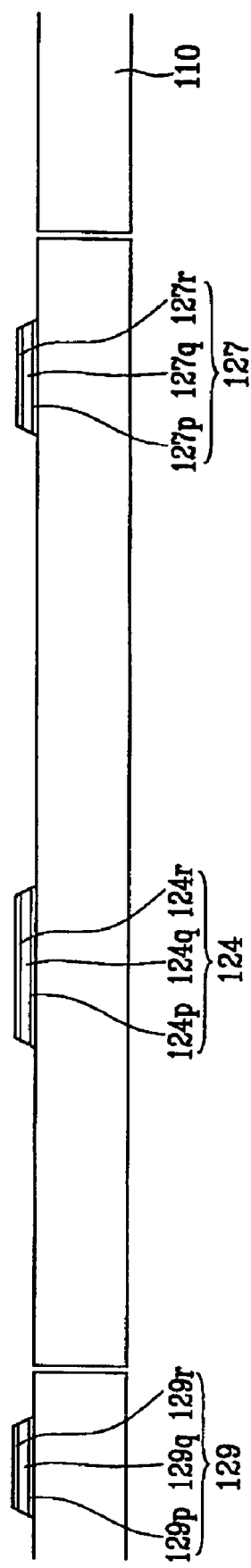

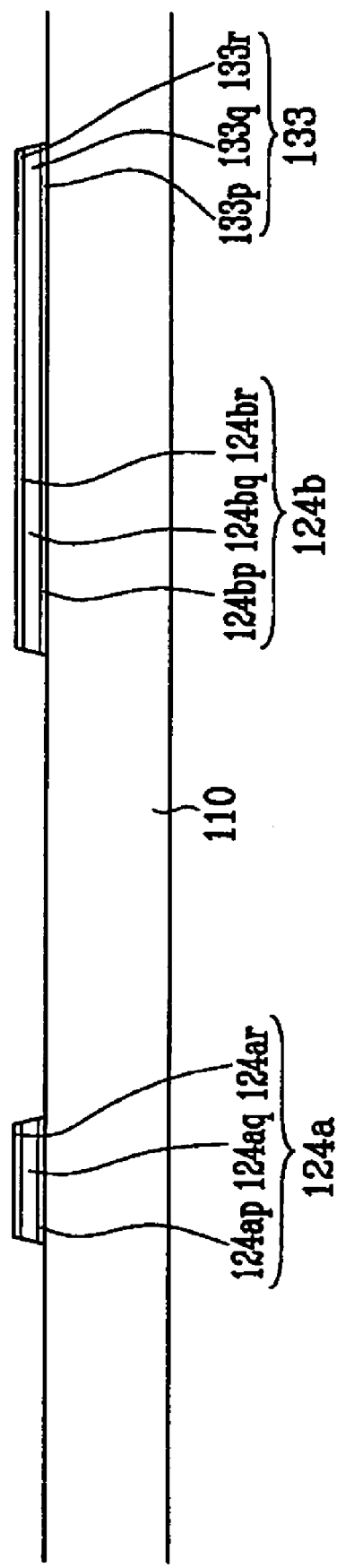

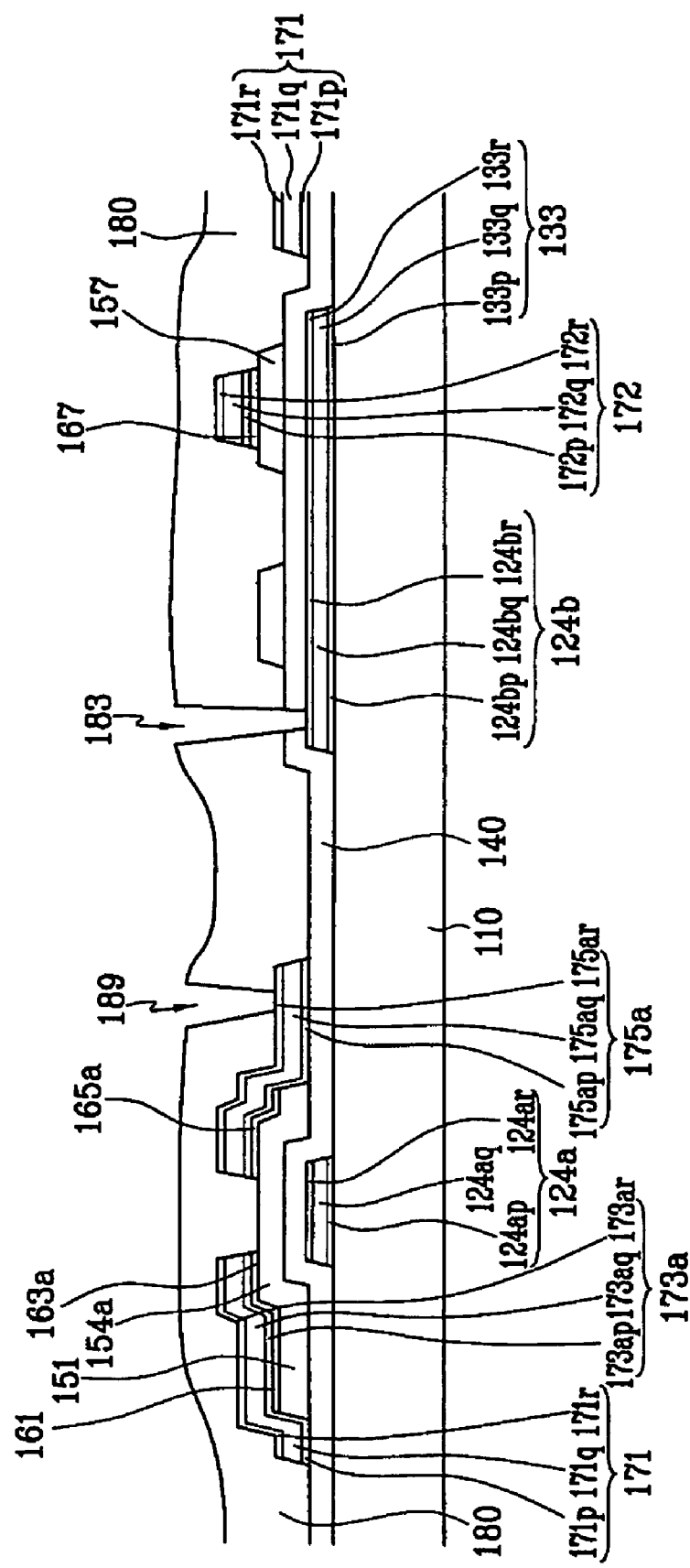

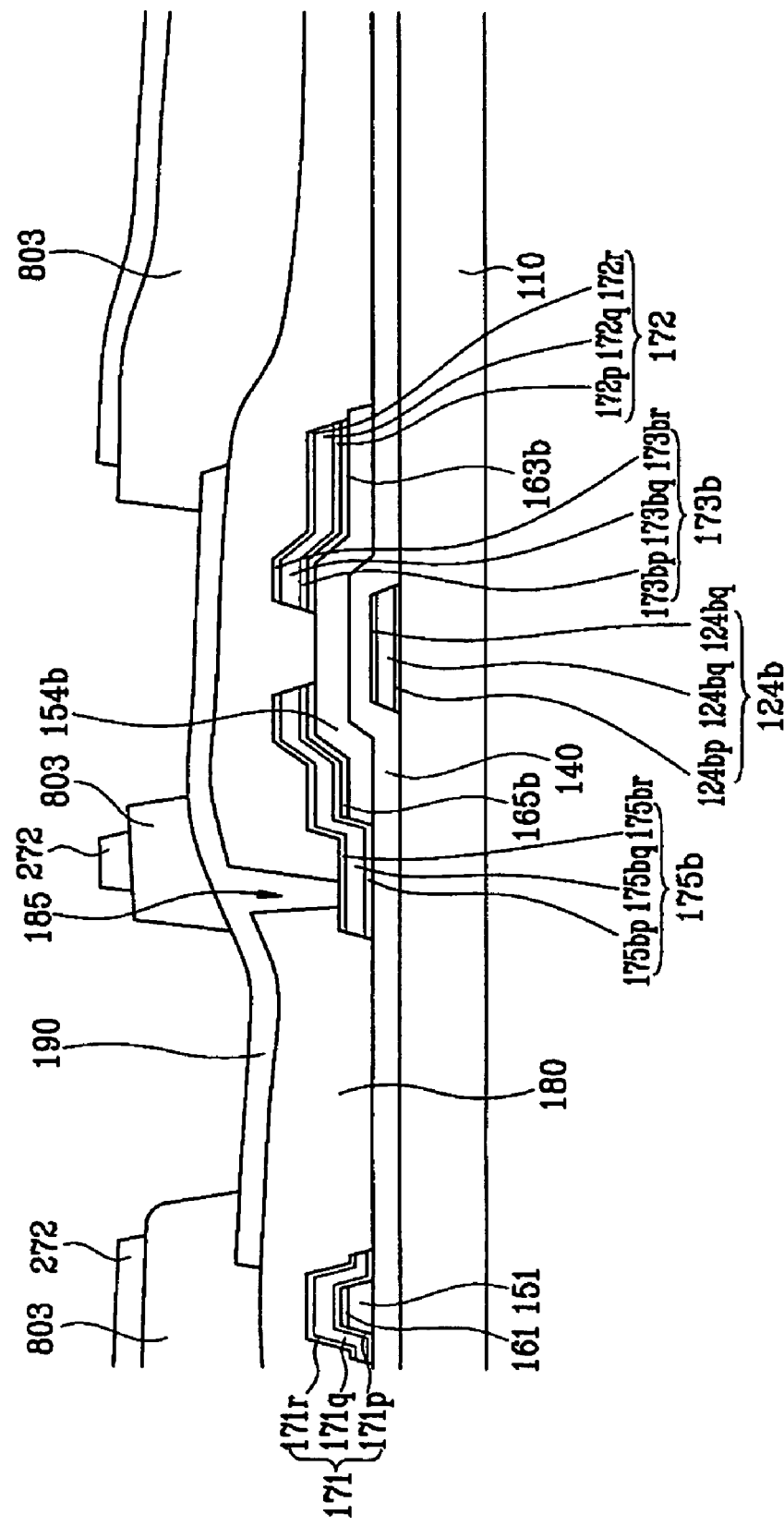

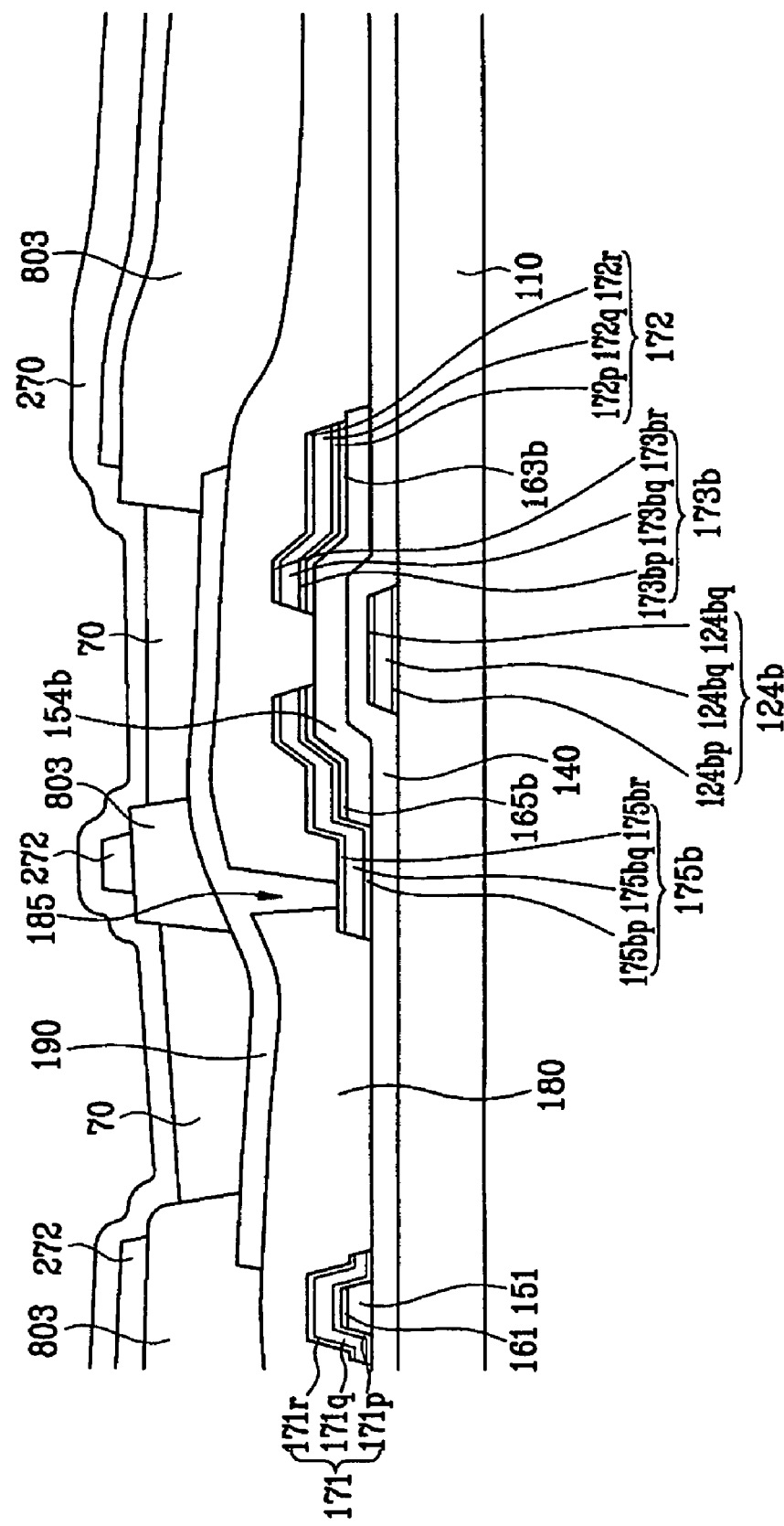

SIGNAL LINE, A THIN FILM TRANSISTOR ARRAY PANEL COMPRISING THE SIGNAL LINE, AND METHOD FOR MANUFACTURING THE SAME

CROSS-REFERENCE TO RELATED APPLICATION

This application claims priority from Korean Patent Application No. 10-2004-0102374 filed on Dec. 7, 2004, the content of which is incorporated by reference herein in its entirety.

BACKGROUND OF THE INVENTION (a) Field of the Invention

The present description relates to a thin film transistor (TFT) array panel for a liquid crystal display (LCD) or an organic light emitting display (OLED), and a manufacturing method for the same.

(b) Description of the Related Art

Liquid crystal displays (LCDs) are one of the most widely used type of flat panel displays. An LCD includes a liquid crystal (LC) layer interposed between two panels provided with field-generating electrodes. The LCD displays images by applying voltages to the field-generating electrodes to generate an electric field in the LC layer, which determines orientations of LC molecules in the LC layer to adjust polarization of incident light.

An LCD including two panels provided with field-generating electrodes, wherein one panel has a plurality of pixel electrodes in a matrix and the other has a common electrode covering the entire surface of the panel, dominates the LCD market.

The LCD displays images by applying a different voltage to each pixel electrode. For this purpose, thin film transistors (TFTs), which have three terminals to switch voltages applied to the pixel electrodes, are connected to the pixel electrodes and gate lines to transmit signals for controlling the thin film transistors and data lines. Using the gate lines and data lines formed on the thin film transistor array panel, voltages are applied to the pixel electrodes.

A TFT is a switching element for transmitting the image signals from the data line to the pixel electrode in response to scanning signals from the gate line. The TFT is applied to an active matrix organic light emitting display as a switching element for controlling respective light emitting elements.

When the size-increase trend of LCDs is considered, a material having low resistivity is desired since the lengths of the gate and data lines increase along with the LCD size. Accordingly, the gate and data lines are required to be formed with a material having low resistivity.

Ag is well-known for use in signal lines and as a conductor having low resistivity. When Ag is used in signal lines, problems caused by high resistance such as signal delay are solved.

However, Ag has its set of disadvantages. For example, it does not adhere well to inorganic or organic layer, resulting in lifting or peeling of Ag signal lines. Also, since Ag is susceptible to breakdown by an acid, Ag does not lend itself to being etched with other materials. These disadvantages make it difficult to take advantage of the low resistivity Ag offers, and present obstacles to using Ag in gate lines and data line.

SUMMARY OF THE INVENTION

It is an object of the present invention to solve the above mentioned problems and to provide a thin film transistor array panel that has signal lines having low resistivity and good reliability.

The present invention provides a signal line comprising a first conductive layer made of a conductive oxide formed at a temperature less than 150° C. and a second conductive layer containing Ag that is deposited adjacent to the first conductive layer.

The present invention provides a thin film transistor array panel including an insulating substrate, a gate line formed on the insulating substrate, a gate insulating layer formed on the gate line, a drain electrode and a data line having a source electrode formed on the gate insulating layer wherein the drain electrode faces the source electrode with a gap therebetween, and a pixel electrode connected to the drain electrode. At least one of the gate line, the data line, and the drain electrode includes a first conductive layer made of a conductive oxide formed at a temperature less than 150° C., and a second conductive layer containing Ag that is deposited adjacent to the first conductive layer.

The present invention provides a manufacturing method of a thin film transistor array panel including forming a gate line having a gate electrode on an insulating substrate, sequentially depositing a gate insulating layer and a semiconductor layer on the gate, forming a drain electrode and a data line having a source electrode on the gate insulating layer and the semiconductor layer wherein the drain electrode faces the source electrode with a gap between the drain electrode and the source electrode, and forming a pixel electrode connected to the drain electrode. At least one step of forming a gate line and forming a data line and drain electrode comprises depositing a conductive oxide layer at a temperature less than 150° C. and depositing a conductive layer of an Ag-containing conductor adjacent to the conductive oxide layer.

BRIEF DESCRIPTION OF THE DRAWINGS

FIG. 3B is a sectional view of the TFT array panel shown in FIG. 3A taken along the line IIIb-IIIb';

FIGS. 10A and 10B are sectional views of the TFT array panel shown in FIG. 9 taken along the lines Xa-Xa' and Xb-Xb', respectively;

FIGS. 16A and 16B are sectional views of the TFT array panel shown in FIG. 15 taken along the lines XVIa-XVIa' and XVIb-XVIb', respectively;

FIGS. 20A and 20B are sectional views of the TFT array panel shown in FIG. 19 taken along the lines XXa-XXa' and XXb-XXb', respectively;

FIGS. 22A and 22B are sectional views of the TFT array panel shown in FIG. 21 taken along the lines XXIIa-XXIIa' and XXIIb-XXIIb', respectively.

DETAILED DESCRIPTION OF THE EMBODIMENTS

Figure 1:
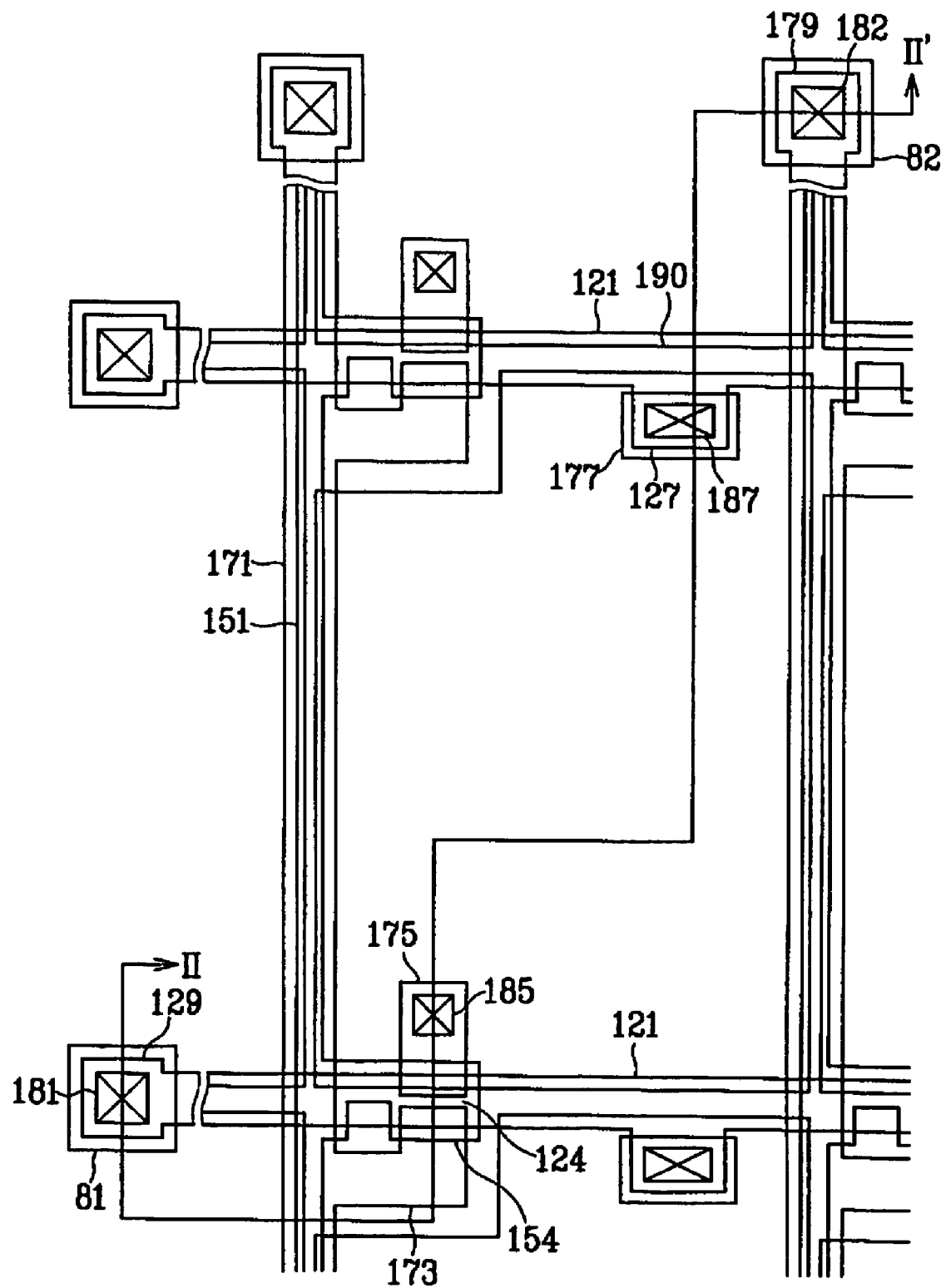
FIG. 1 is a layout view of a TFT array panel for an LCD according to an embodiment of the present invention.

Embodiments of the present invention will be described more fully hereinafter with reference to the accompanying drawings, in which embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may be present.

Now, TFT array panels for an LCD and an OLED and manufacturing methods thereof according to embodiments of this invention will be described in detail with reference to the accompanying drawings.

Embodiment 1

First, a TFT array panel for an LCD according to an embodiment of the present invention will be described in detail with reference to FIGS. 1 and 2.

Figure 2:
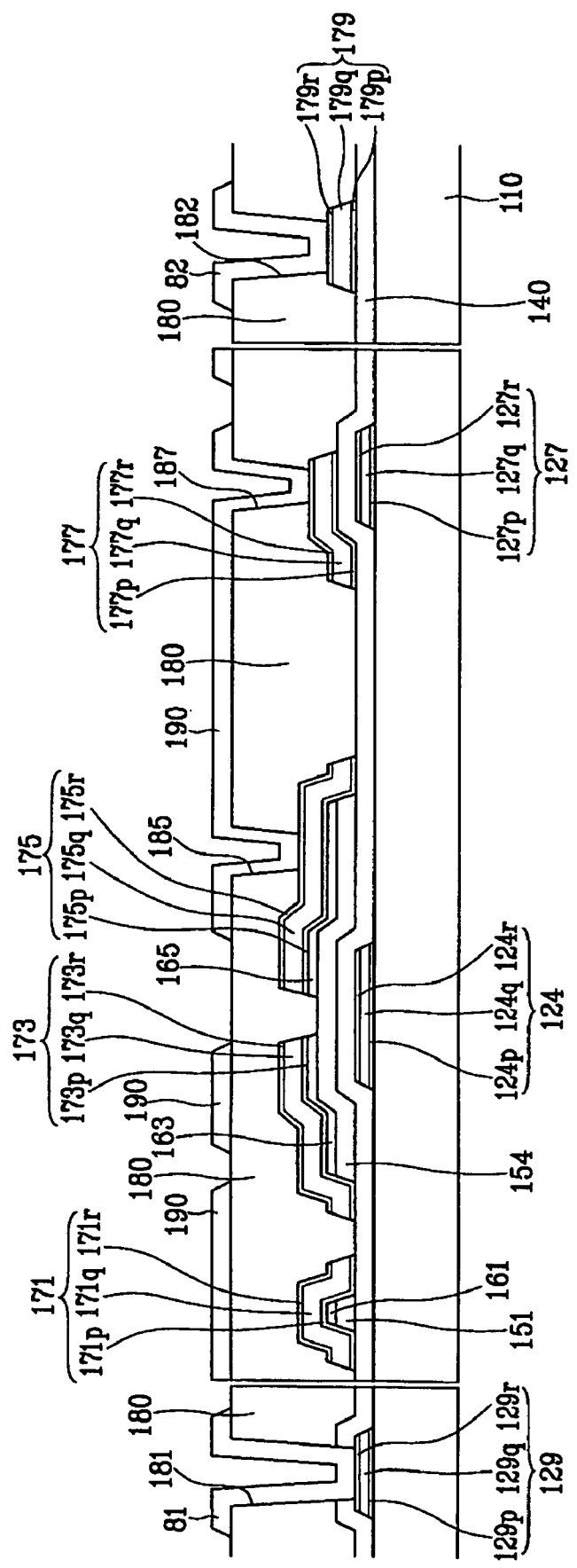
FIG. 2 is a sectional view of the TFT array panel shown in FIG. 1 taken along the line II-II.

FIG. 1 is a layout view of a TFT array panel for an LCD according to an embodiment of the present invention, and FIG. 2 is a sectional view of the TFT array panel shown in FIG. 1 taken along the line II-II.

A plurality of gate lines 121 for transmitting gate signals are formed on an insulating substrate 110. The gate lines 121 are mainly formed in the horizontal direction, and partial portions thereof become a plurality of gate electrodes 124. Also, different partial portions thereof that extend in a lower direction become a plurality of expansions 127. An end portion 129 of the gate line 121 has an expanded width for connecting with an external device such as a driving circuit.

The gate line 121 has first layers 124p, 127p, and 129p, second layers 124q, 127q, and 129q, and third layers 124r, 127r, and 129r. The first layers 124p, 127p, and 129p are made of a conductive oxide such as indium tin oxide (ITO) or indium zinc oxide (IZO) and are formed on the substrate 110. The second layers 124q, 127q, and 129q are made of an Ag-containing metal such as Ag itself or an Ag alloy and are formed on the first layers 124p, 127p, and 129p. The third layers 124r, 127r, and 129r are made of a conductive oxide such as ITO or IZO and are formed on the second layers 124q, 127q, and 129q.

When a conductive oxide layer is disposed between an Ag layer and a substrate, adhesiveness between the Ag layer and the substrate is enhanced to prevent the Ag layer from peeling and lifting.

When the conductive oxide layer is made of amorphous ITO, adhesiveness between the Ag layer and the substrate is particularly enhanced.

An amorphous ITO layer has high surface roughness. That is, an amorphous ITO layer has highly uneven surfaces, which increases contact areas between the amorphous ITO layer and the underlying substrate and the upper Ag layer to enhance their adhesiveness. Furthermore, the amorphous ITO layer formed at a low temperature undergoes a high temperature treatment at about 200° C. to be crystallized while forming the gate insulating layer 140 and a semiconductor layer 151.

Here, the third layers 124r, 127r, and 129r prevent the Ag in the second layers 124q, 127q, and 129q from diffusing into a gate insulating layer 140 formed thereon.

An Ag layer and a conductive oxide layer such as an ITO layer or an IZO layer can be etched under the same etching condition. Since Ag is weak to an acid and can be etched fast by an acid, a weak acid is generally used to etch the Ag layer. However, since other metals such as Mo and Cr are etched much slower than Ag, two different etching conditions have to be used when such metals are applied as an underlayer for the Ag layer. In contrast, amorphous ITO can be etched with the Ag layer by the same etchant. Since amorphous ITO has a lot of dangling bonds (which is a characteristic of an amorphous material), the amorphous ITO is etched by a weak acid like Ag.

Figure 23A:
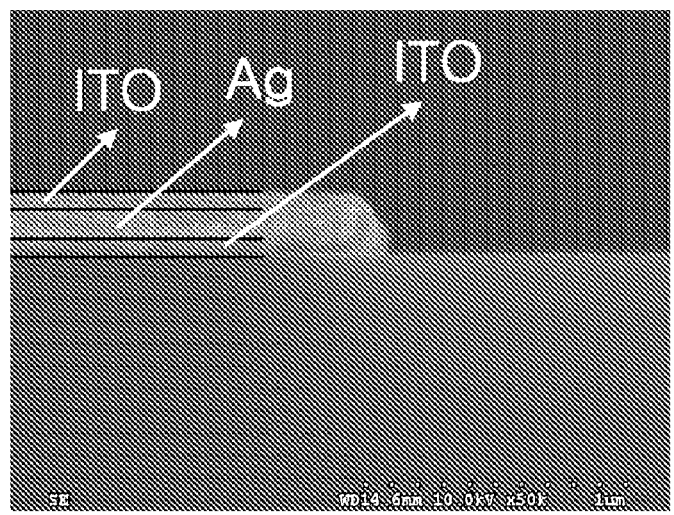
FIGS. 23A to 23C are pictures illustrating profiles of triple layers of an amorphous ITO, an Ag layer, and another amorphous ITO.

FIG. 23A illustrates profiles of a triple-layer structure including an amorphous ITO, an Ag layer, and another amorphous ITO. All three layers are simultaneously etched with an etchant. FIG. 23A shows that the simultaneously etching resulted in a good profile.

The first layers 124p, 127p, and 129p and the third layers 124r, 127r, and 129r may be formed of a nitrogenated conductive oxide such as ITON to prevent oxidation of Ag at the interfaces of the second layers 124q, 127q, and 129q, the first layers 124p, 127p, and 129p, and the third layers 124r, 127r, and 129r. The ITON layer is formed by exposing the ITO layer to a nitrogen atmosphere and prevents rapid increasing of resistance due to Ag oxidation.

The lateral sides of the third layers 124r, 127r, and 129r, the second layers 124q, 127q, and 129q, and the first layers 124q, 127q, and 129q are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151, preferably made of hydrogenated amorphous silicon (abbreviated to "a-Si"), are formed on the gate insulating layer 140. Each semiconductor stripe 151 extends substantially in the longitudinal direction and is curved periodically. Each semiconductor stripe 151 has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes 161 and islands 165, preferably made of silicide or n+ hydrogenated a-Si heavily doped with n-type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmic contacts 161 and 165 are tapered, and the inclination angles of the edge surfaces of the semiconductor stripes 151 and the ohmic contacts 161 and 165 are preferably in a range of about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171, for transmitting data voltages, extend substantially in the longitudinal direction and intersect the gate lines 121 to define pixel areas arranged in a matrix. Each data line 171 has a plurality of branches that project toward the drain electrodes 175 and form a plurality of source electrodes 173. Each data line 171 has an end portion 179 having an enlarged width. Each pair of the source electrodes 173 and the drain electrodes 175 are separated from each other on the gate electrodes 124.

The data line 171, the drain electrode 175, and the storage capacitor conductor 177 have first layers 171$p$, 175$p$, and 177$p$, second layers 171$q$, 175$q$, and 177$q$, and third layers 171$r$, 175$r$, and 177$r$. The first layers 171$p$, 175$p$, and 177$p$ and the third layers 171$r$, 175$r$, and 177$r$ are respectively disposed at lower and upper sides of the second layers 171$q$, 175$q$, and 177$q$. The first layers 171$p$, 175$p$, and 177$p$ and the third layers 171$r$, 175$r$, and 177$r$ are made of a conductive oxide. The second layers 171$q$, 175$q$, and 177$q$ are made of an Ag-containing metal such as Ag itself or an Ag alloy.

The first layers 171$p$, 175$p$, and 177$p$ and the third layers 171$r$, 175$r$, and 177$r$ may be made of ITO. Here the first layers 171$p$, 175$p$, and 177$p$ and the third layers 171$r$, 175$r$, and 177$r$ of a conductive oxide prevent Ag of the second layers 171$q$, 175$q$, and 177$q$ from diffusing into the semiconductor layer 151 and a pixel electrode 190 formed thereon. When the conductive oxide layer is made of ITO, amorphous ITO is preferable. Since the amorphous ITO is etched along with Ag under the same etching condition, they are simultaneously patterned to form the data lines 171 and result in a good profile.

Since Ag is etched fast by an acid, a weak acid is generally used to etch the Ag layer. However, since other metals such as Mo and Cr are etched much slower than Ag, two different etching conditions have to be used when such metals are employed as an underlayer for the Ag layer. In contrast, since the amorphous ITO has a lot of dangling bonds, the amorphous ITO is etched by a weak acid. Accordingly, the amorphous ITO can be etched along with the Ag layer by the same etchant.

The first layers 171$p$, 175$p$, and 177$p$ and the third layers 171$r$, 175$r$, and 177$r$ is preferably formed of an ITON layer to prevent oxidation of Ag at the interface of the second layers 171$q$, 175$q$, and 177$q$ and the first and third layers 171$p$, 175$p$, 177$p$, 171$r$, 175$r$, and 177$r$. The ITON layer is formed by exposing the ITO layer to a nitrogen atmosphere and prevents rapid increasing of resistance due to Ag oxidation.

The data lines 171, the drain electrodes 175, and the storage capacitor conductor 177 have tapered edge surfaces, and the incline angles of the edge surfaces are in a range of about 30-80 degrees.

A gate electrode 124, a source electrode 173, and a drain electrode 175, along with a projection 154 of a semiconductor stripe 151, forms a TFT having a channel formed in the projection 154 disposed between the source electrode 173 and the drain electrode 175. The storage capacitor conductor 177 overlaps the expansion 127 of the gate line 121.

The ohmic contacts 161 and 165 are only interposed between the semiconductor stripe 151 and the data line 171 and between the drain electrode 175 and the projection 154 of the semiconductor stripe 151 in order to reduce contact resistance therebetween.

The semiconductor stripe 151 is partially exposed between the source electrode 173 and the drain electrode 175 and at other places not covered with the data line 171 and the drain electrode 175. Most of the semiconductor stripe 151 is narrower than the data line 171 but the width of the semiconductor stripe 151 broadens near a place where the semiconductor stripe 151 and the gate line 121 meet each other in order to prevent disconnection of the data line 171.

On the data line 171, the drain electrode 175, the storage capacitor conductor 177, and the exposed region of the semiconductor stripe 151, a passivation layer 180 is provided, which is made of an organic material having substantial planarization properties and photosensitivity or an insulating material with a low dielectric constant such as a-Si:C:O, a-Si:O:F, etc. This passivation layer 180 is formed by plasma enhanced chemical vapor deposition (PECVD). To prevent the organic material of the passivation layer 180 from contacting with the semiconductor strips 151 exposed between the data line 171 and the drain electrode 175, the passivation layer 180 can be structured in a way that an insulating layer made of SiNx or $SiO_2$ is additionally formed under the organic material layer.

In the passivation layer 180, a plurality of contact holes 181, 185,187, and 182 are formed to expose an end portion 129 of the gate line 121, the drain electrode 175, the storage capacitor conductor 177, and an end portion 179 of the data line 171 respectively.

A plurality of pixel electrodes 190 and a plurality of contact assistants 81 and 82, which are made of IZO or ITO, are formed on the passivation layer 180.

Since the pixel electrode 190 is physically and electrically connected with the drain electrode 175 and the storage capacitor conductor 177 through the contact holes 185 and 187, respectively, the pixel electrode 190 receives the data voltage from the drain electrodes 175 and transmits it to the storage capacitor conductor 177.

The pixel electrode 190 to which the data voltage is applied generates an electric field with a common electrode (not illustrated) of the opposite panel (not illustrated) to which a common voltage is applied, so that the liquid crystal molecules in the liquid crystal layer are rearranged.

Also, as mentioned above, the pixel electrode 190 and the common electrode form a capacitor to store and preserve the received voltage after the TFT is turned off. This capacitor will be referred to as a "liquid crystal capacitor." To enhance the overall voltage storage ability, another capacitor is provided, which is connected with the liquid crystal capacitor in parallel and will be herein referred to as a "storage capacitor." The storage capacitor is formed at an overlapping portion of the pixel electrode 190 and the adjacent gate line 121, which will be herein referred to as "previous gate line." The expansion 127 of the gate line 121 is provided to ensure the largest possible overlap dimension and thus to increase storage capacity of the storage capacitor. The storage capacitor conductor 177 is connected to the pixel electrode 190 and is overlapped with the expansion 127, and is provided at the bottom of the passivation layer 180 so that the pixel electrode 190 becomes close to the previous gate line 121.

The contact assistant 81 and 82 are respectively connected to the end portions 129 and 179 of the gate line 121 and the data line 171. The contact assistants 81 and 82 supplement the adhesion between the end portion 129 of the gate line 121 and the exterior devices such as the driving integrated circuit, and between the end portion 179 of the data line 171 and the exterior devices, respectively, and protects them. Applying the contact assistants 81 and 82 is optional.

A method of manufacturing a TFT array panel will now be described in detail with reference to FIGS. 3A to 6B as well as FIGS. 1 and 2.

Figure 3A:
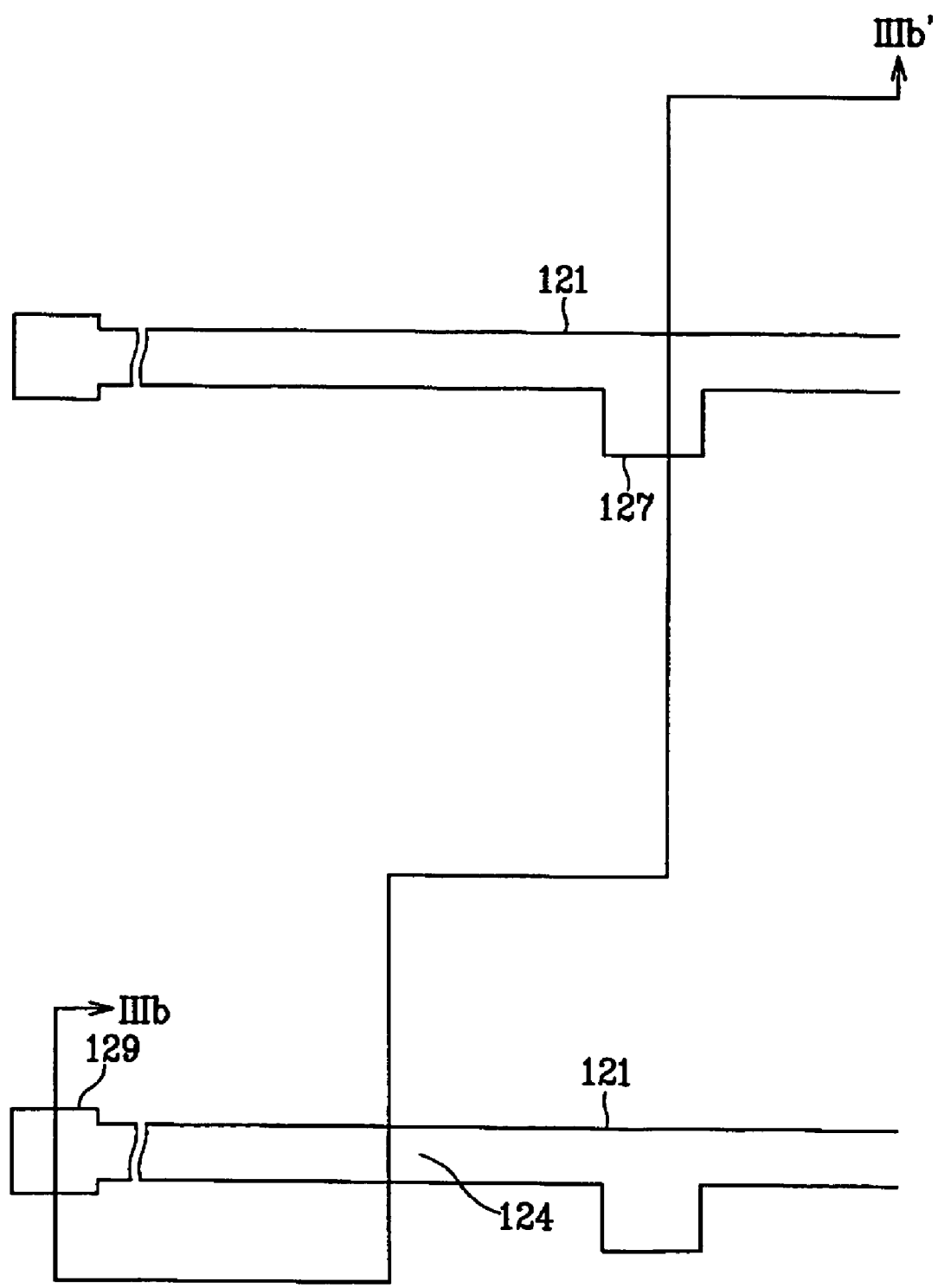
FIGS. 3A, 4A, 5A, and 6A are layout views sequentially illustrating the intermediate steps of a method of manufacturing a TFT array panel for an LCD according to the embodiment of FIGS. 1 and 2.

At first, as shown in FIGS. 3A and 3B, a first layer of a conductive oxide such as ITO or IZO, a second layer of Ag-containing metal, and a third layer of a conductive oxide such as ITO or IZO are deposited on an insulating substrate 110.

The first layer and the second layer are deposited by co-sputtering. Two targets are installed in a same sputtering chamber for the co-sputtering process. One target is made of a conductive oxide such as ITO or IZO. The other target is made of an Ag-containing metal such as Ag or an Ag alloy. Hereinafter, an ITO target and an Ag target will be exemplified.

The co-sputtering is performed as follows.

At first, power is applied only to the ITO target and not to the Ag target to deposit a first ITO layer. The sputtering is performed at a temperature less than 150° C., preferably in a room temperature, and with applying hydrogen gas ($H_2$) or water vapor ($H_2O$). Such condition makes the ITO layer amorphous. The resulting ITO layer has a thickness of about 30 Å to about 300 Å. Nitrogen gas ($N_2$), nitrous oxide ($N_2O$), or ammonia ($NH_3$) may be applied during the sputtering of the ITO target to form an ITON layer instead of the ITO layer.

Next, power is switched to be applied only to the Ag target and not to the ITO target to deposit an Ag layer. The Ag layer has a thickness of about 1,000 Å to about 3,000 Å

Next, power is switched again to be applied to the ITO target and not to the Ag target to deposit a second ITO layer. The sputtering is performed at a temperature less than 150° C., preferably in a room temperature, and with applying hydrogen gas ($H_2$) or water vapor ($H_2O$). Such condition makes the ITO layer amorphous. Like the first ITO layer, the second ITO layer has a thickness of about 30 Å to about 300 Å.

When the ITO layer has a thickness less than 30 Å, the Ag layer may directly contact the substrate 110 and degrade adhesiveness. When the ITO layers has a, thickness greater than 300 Å, it may induce bad ohmic contact with other conductive layers. As mentioned above, nitrogen gas ($N_2$), nitrous oxide ($N_2O$), or ammonia ($NH_3$) may be applied during sputtering the ITO target to form an ITON layer instead of the ITO layer.

When a conductive oxide layer is disposed between an Ag layer and a substrate 110, adhesiveness between the Ag layer and the substrate 110 is enhanced to prevent peeling and lifting of the Ag layer.

When the conductive oxide layer is deposited at a temperature less than 150° C., an amorphous ITO layer having dangling bonds is formed. Accordingly, adhesiveness between the Ag layer and the substrate 110 is particularly enhanced. An amorphous ITO layer has high surface roughness. That is, an amorphous ITO layer has highly uneven surfaces which increase contact areas between the amorphous ITO layer and the underlying substrate and the upper Ag layer to enhance their adhesiveness. Furthermore, the amorphous ITO layer formed at the low temperature undergoes a high temperature treatment at about 200 to about 400° C. to be crystallized while forming the gate insulating layer 140 and a semiconductor layer 151.

The amorphous ITO layer prevents diffusion of Ag to other layers.

When nitrogen gas ($N_2$), nitrous oxide ($N_2O$), or ammonia ($NH_3$) is applied during the sputtering of the ITO or IZO target, an ITON or IZON layer is formed to prevent oxidation of the Ag layer at the interface.

As in the above descriptions, when an amorphous ITO or IZO layer is disposed between an Ag layer and a substrate, adhesiveness between the Ag layer and the substrate and etching efficiency are enhanced.

Then, photoresist is coated on the second ITO layer and is illuminated with light through a photo-mask. The illuminated photoresist is then developed.

The two ITO layers and the Ag layer are simultaneously etched to form a plurality of gate lines 121, with an etchant. The etchant may be one of hydrogen peroxide ($H_2O_2$) or a common etchant containing an appropriate amount of phosphoric acid ($H_2PO_3$), nitric acid ($HNO_3$), and acetic acid ($CH_3COOH$).

An amorphous ITO layer or an amorphous IZO layer can be etched by a weak acid. Since Ag is etched fast with an acid, a weak acid is generally used to etch the Ag layer. Since the amorphous ITO or IZO can be etched along with the Ag layer by a weak acid, they are simultaneously patterned to form the gate line 121.

Through the above-described processes, as shown in FIGS. 3A and 3B, a plurality of gate lines 121 having a plurality of gate electrodes 124, expansions 127, and end portions 129 are formed.

Figure 4A:
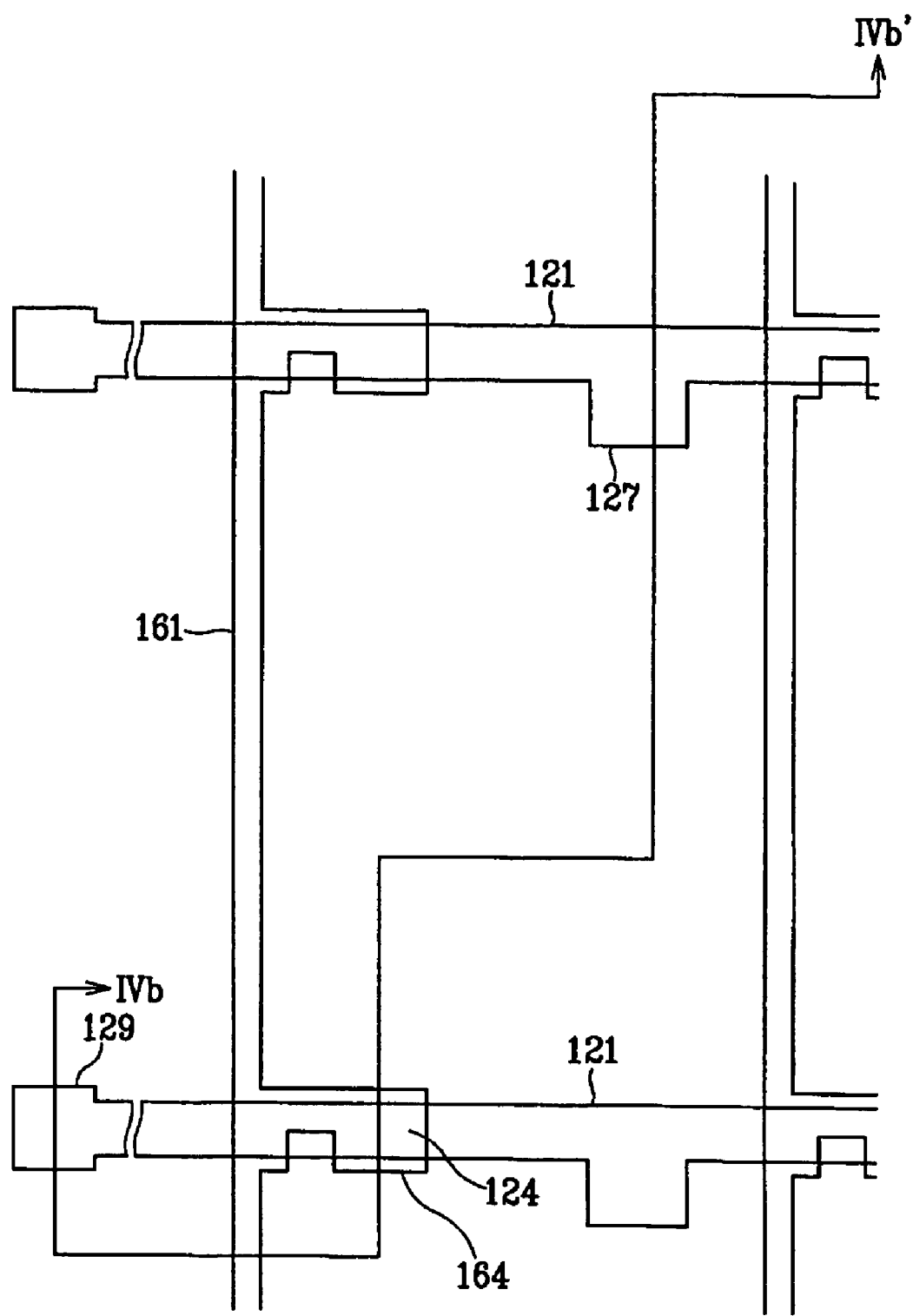
Figure 4B:
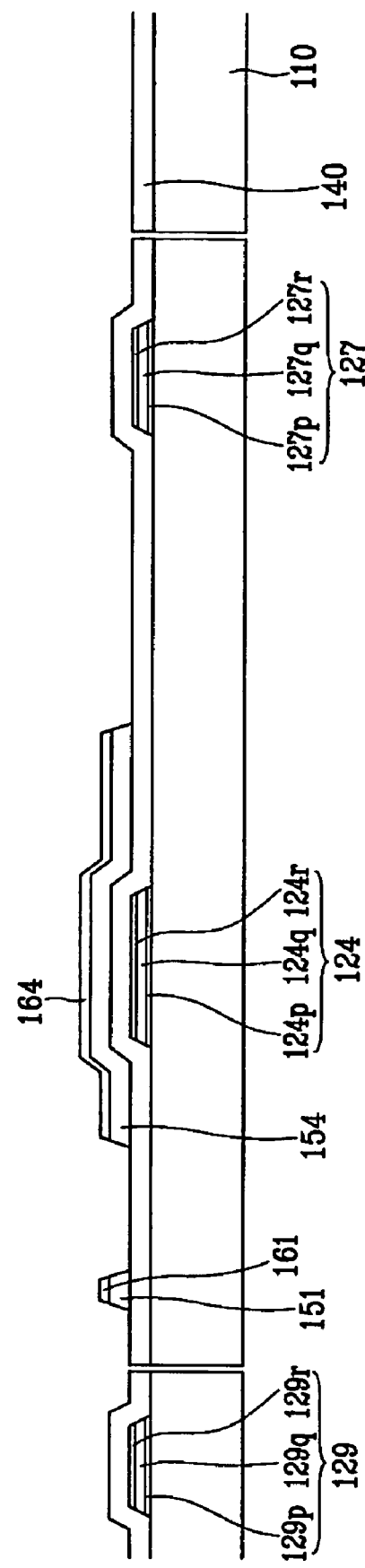
FIG. 4B is a sectional view of the TFT array panel shown in FIG. 4A taken along the line IVb-IVb' in the step following the step shown in FIG. 3B.

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 having projections 164 and 154, respectively. The gate insulating layer 140 is preferably made of silicon nitride with a thickness of about 2,000 Å to about 5,000 Å, and the deposition temperature is preferably in a range between about 250° C. and about 500° C.

Since this process is performed at a high temperature over 200° C., the amorphous ITO of the gate line 121 is crystallized.

Figure 23B:
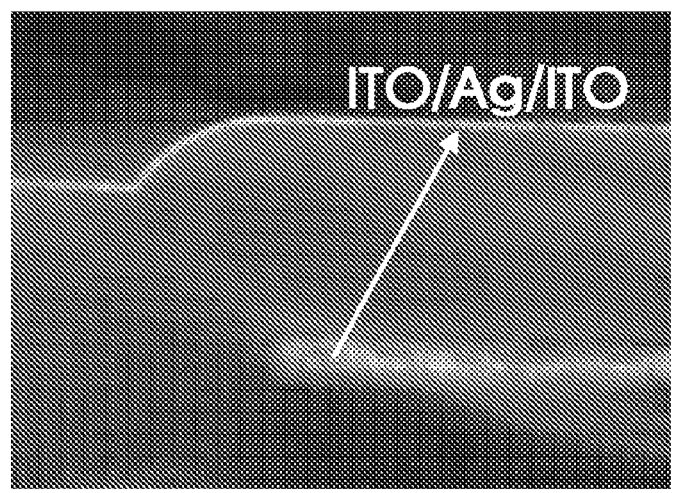

FIG. 23B illustrates a profile of a gate line after depositing the gate insulating layer 140, the intrinsic amorphous silicon, and extrinsic amorphous silicon.

FIG. 23B shows that the gate line 121 maintains its good profile without lifting or peeling.

Next, a first layer of a conductive oxide such as ITO, a second layer of a Ag-containing metal, and a third layer of a conductive oxide such as ITO are sequentially deposited on the extrinsic semiconductor stripes 161. The first and third layers have a thickness of about 30 Å to about 300 Å, and the second layer has a thickness of about 1,000 Å to about 3,000 Å.

The first layer and the third layer of a conductive oxide prevent Ag of the second layer from diffusing into the semiconductor layer 151 and a pixel electrode 190, which will be formed thereon.

When the first layer and the third layer are formed of ITO, the sputtering process is preferably performed at a temperature less than 150° C., while applying hydrogen gas ($H_2$) or water vapor ($H_2O$). Such condition causes the ITO layer to be amorphous. An ITO layer formed at a temperature less than 150° C. has an amorphous state.

Since the amorphous ITO has many dangling bonds, the amorphous ITO is highly reactive to an acid. Accordingly, the amorphous ITO is etched with a weak acid. Since the amorphous ITO can be etched along with the Ag layer by a weak acid, they can be simultaneously patterned.

When nitrogen gas ($N_2$), nitrous oxide ($N_2O$), or ammonia ($NH_3$) is applied during the sputtering of the ITO target, an ITON layer is formed to prevent oxidation of the Ag layer at the interface.

Here, the ITO layer has a thickness of about 30 Å to about 300 Å. When the ITO layers has a thickness less than 30 Å, the Ag layer may directly contact the substrate 110 to degrade adhesiveness. When the ITO layers has a thickness greater than 300 Å, it may induce bad ohmic contact with other conductive layers.

Then, photoresist is coated on the third layer and is illuminated with light through a photo-mask, and the illuminated photoresist is then developed.

The first to third layers are simultaneously etched to form a plurality of data lines 171 with an etchant. The etchant may be one of hydrogen peroxide ($H_2O_2$) or a common etchant containing an appropriate amount of phosphoric acid ($H_2PO_3$), nitric acid ($HNO_3$), and acetic acid ($CH_3COOH$).

Figure 5A:
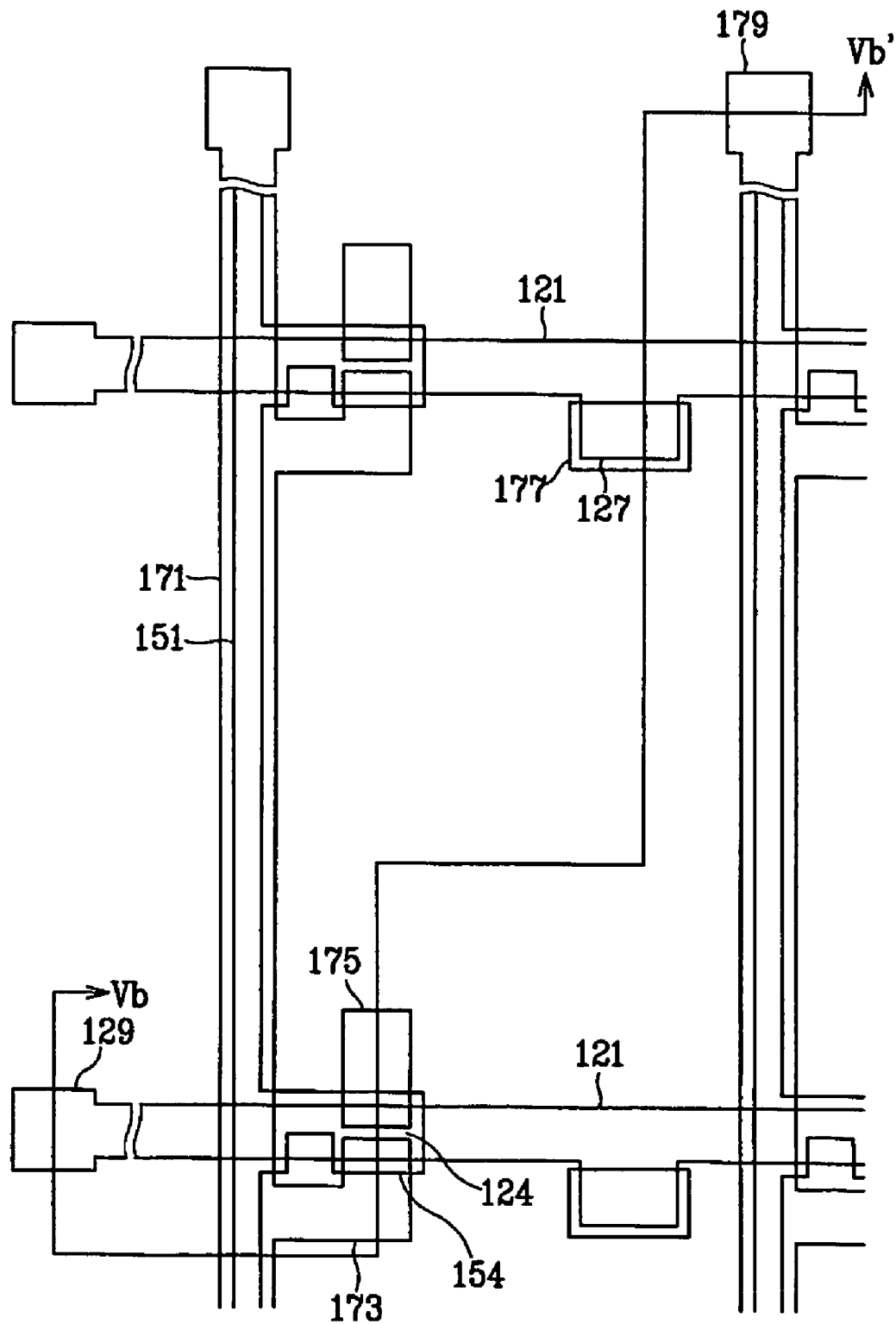
Figure 5B:
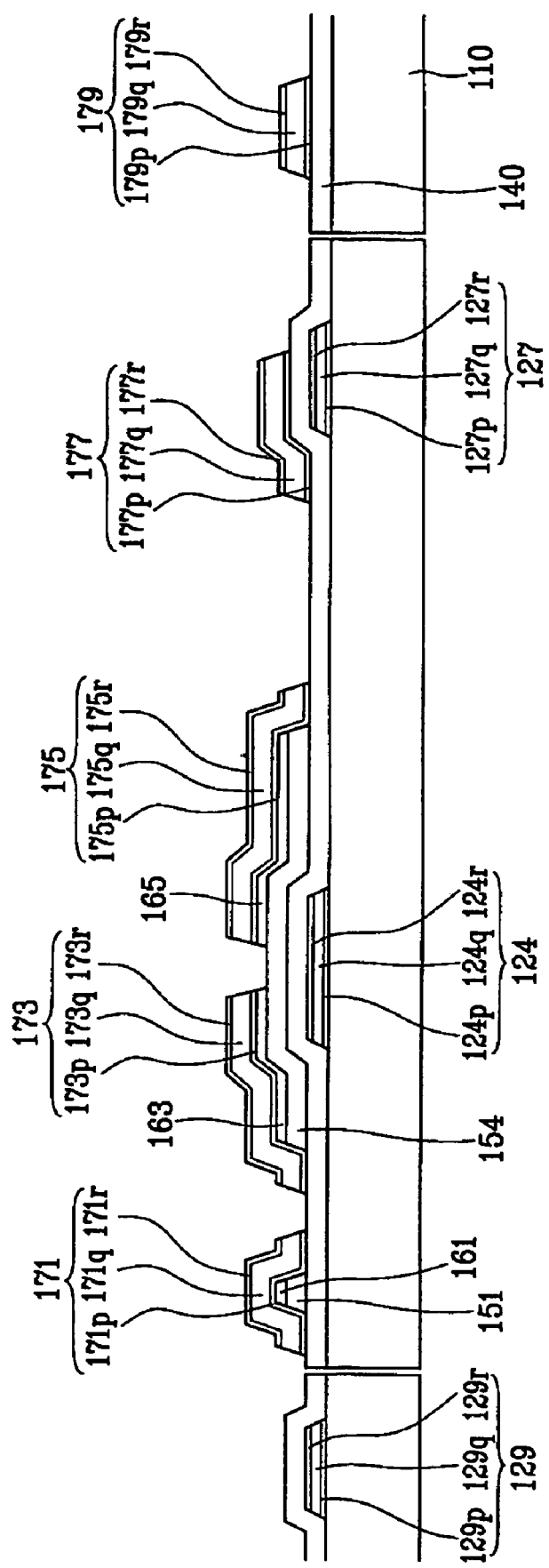
FIG. 5B is a sectional view of the TFT array panel shown in FIG. 5A taken along the line Vb-Vb' in the step following the step shown in FIG. 4B.

Through the above-described processes, as shown in FIGS. 5A and 5B, a plurality of data lines 171 having a plurality of source electrode 173, a plurality of drain electrodes 175, an end portion 179, and storage capacitor conductors 177 are formed.

Next, portions of the extrinsic semiconductor stripes 161, which are not covered with the data lines 171 and the drain electrodes 175, are removed by etching to complete a plurality of ohmic contacts 163 and 165 and to expose portions of the intrinsic semiconductor stripes 151. Oxygen plasma treatment may follow thereafter in order to stabilize the exposed surfaces of the semiconductor stripes 151.

Figure 6A:
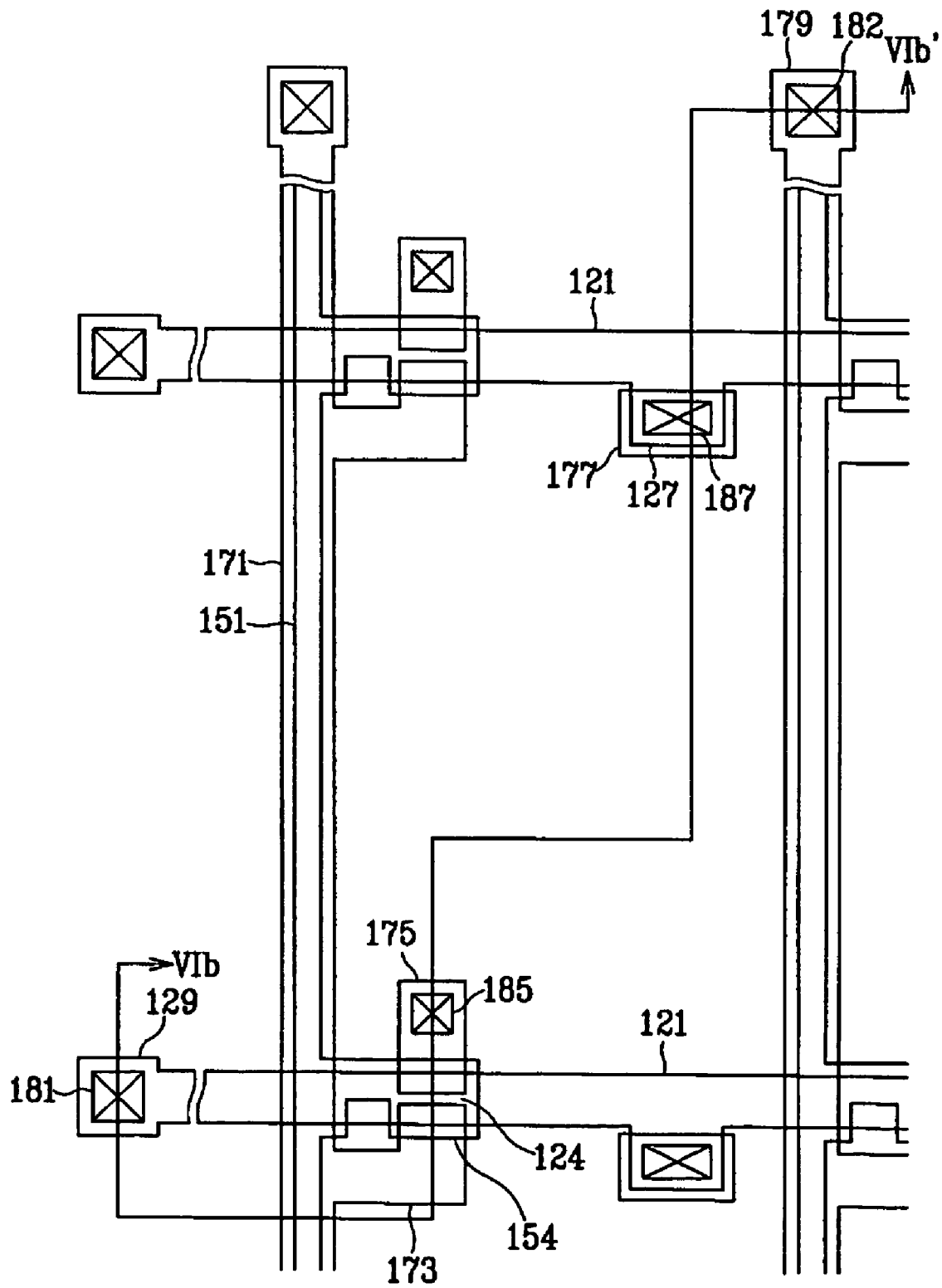
Figure 6B:
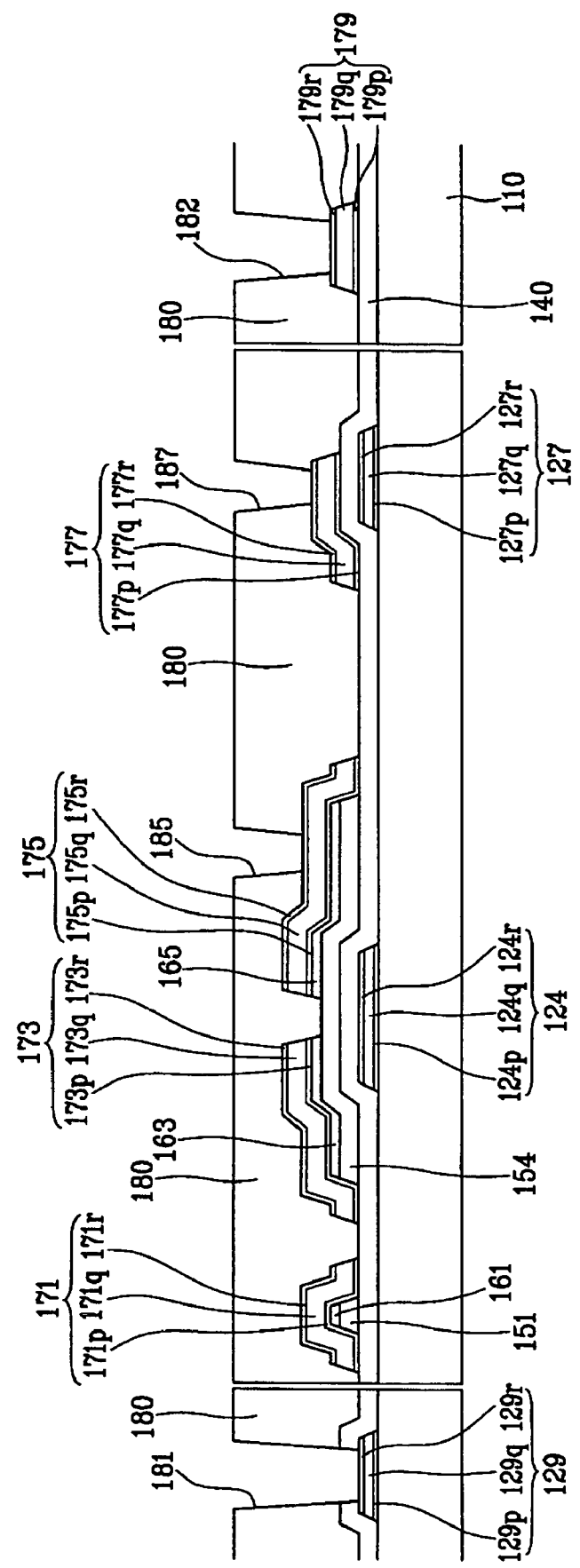
FIG. 6B is a sectional view of the TFT array panel shown in FIG. 6A taken along the line VIb-VIb' in the step following the step shown in FIG. 5B.

Referring to FIGS. 6A and 6B, a passivation layer 180 is deposited and dry etched along with the gate insulating layer 140 to form a plurality of contact holes 181, 185, 187, and 182. The gate insulating layer 140 and the passivation layer 180 are preferably etched under an etch condition having substantially the same etch ratio for both the gate insulating layer 140 and the passivation layer 180.

When the passivation layer is made of a photosensitive material, the contact

Since this process is performed at a high temperature of over 200° C., the amorphous ITO of the data line 171 is crystallized.

Figure 23C:
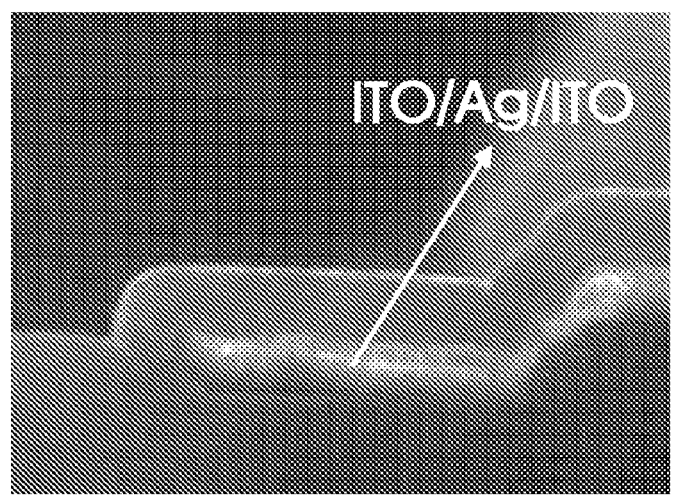

FIG. 23C illustrates a gate line after forming the passivation layer 180. FIG. 23B shows that the data line 171 maintains its good profile without lifting or peeling.

Next, an indium tin oxide (ITO) layer is deposited on the passivation layer 180 to a thickness of about 400 Å to about 1500 Å, and is patterned to form a plurality of pixel electrodes 190 and contact assistants 81 and 82.

In the present embodiment, ITO is used the primary conductive oxide. However, this is not a limitation of the invention and another conductive oxide such as IZO may be applied as a conductive oxide in other embodiments.

In the present embodiment, both of gate lines and data lines have triple-layered structures including a conductive oxide layer, an Ag layer, and another conductive oxide layer. However, this is not a limitation of the invention and only one of the gate lines and data lines may have a triple-layered structure in other embodiments.

In the present embodiment, conductive oxide layers are disposed at lower and upper sides of an Ag layer. However, this is not a limitation of the embodiment and one of the upper and lower conductive oxides may be omitted in other embodiments.

Embodiment 2

Now, a TFT panel for an active matrix organic light emitting display (AM-OLED) according to another embodiment of the present invention will be described.

Figure 7:
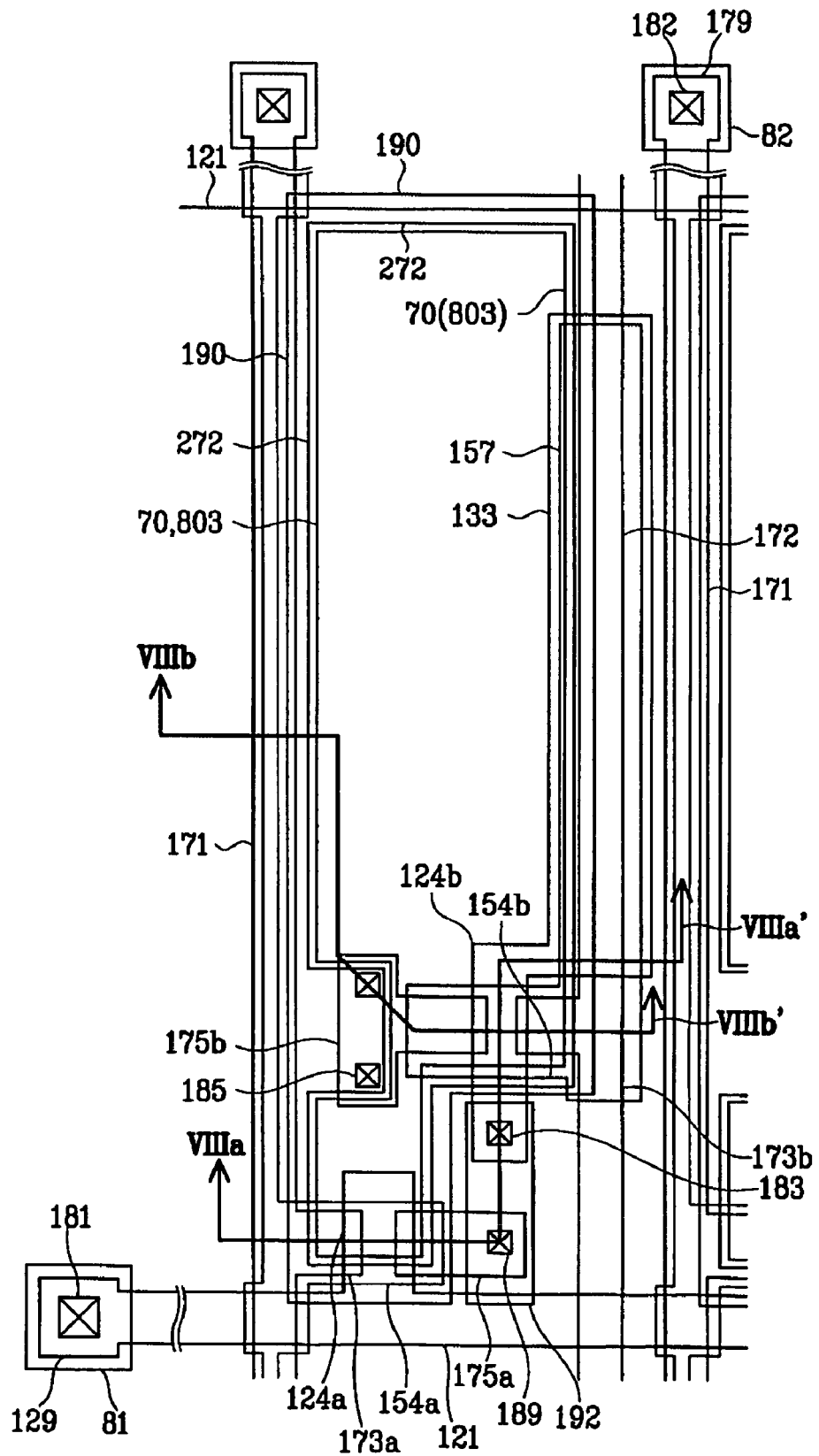
FIG. 7 is a layout view of a TFT array panel for an OLED according to another embodiment of the present invention.
Figure 8A:
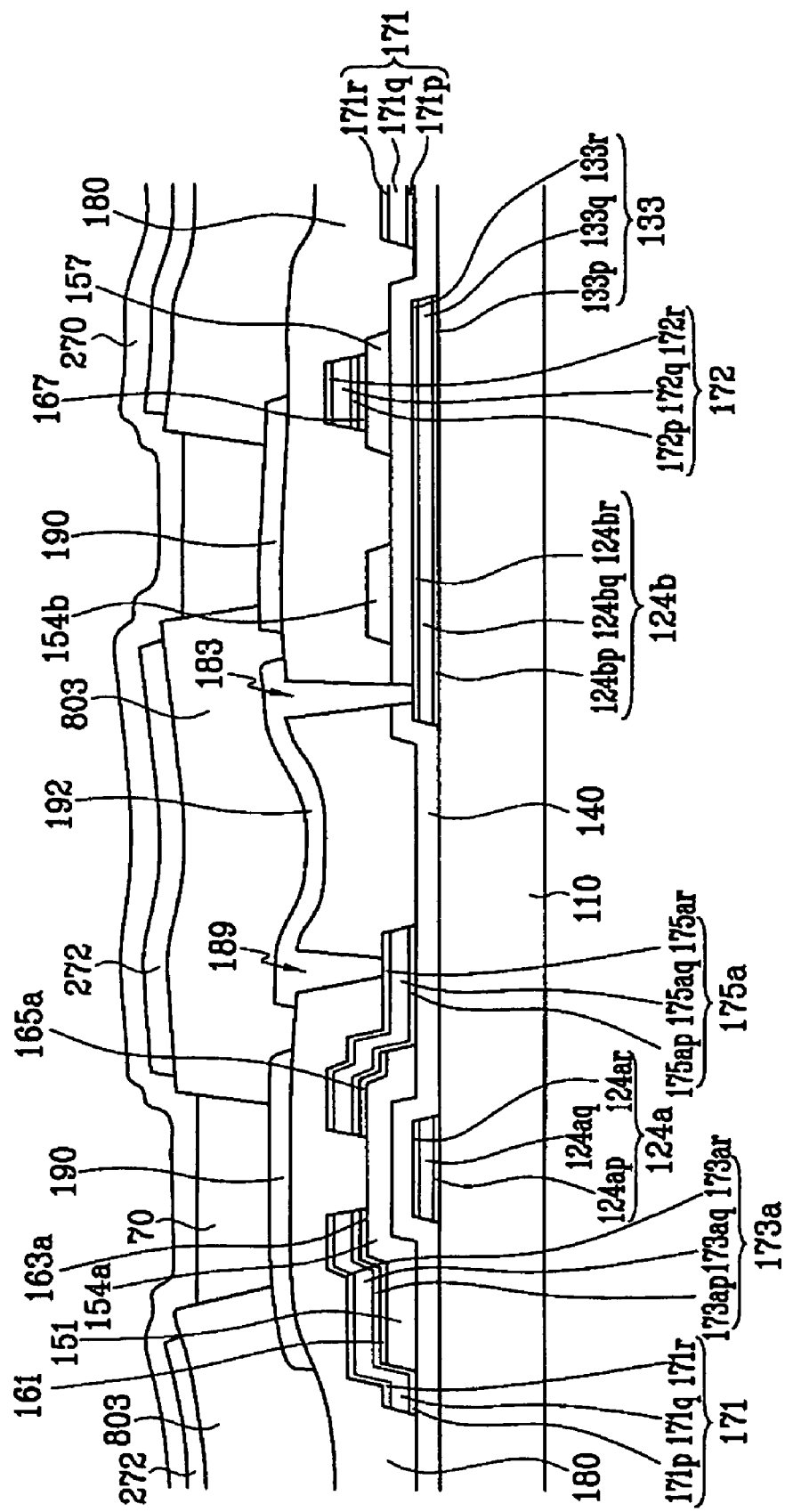
FIGS. 8A and 8B are sectional views of the TFT array panel shown in FIG. 7 taken along the line VIIIa-VIIIa' and the line VIIIb-VIIIb', respectively.
Figure 8B:
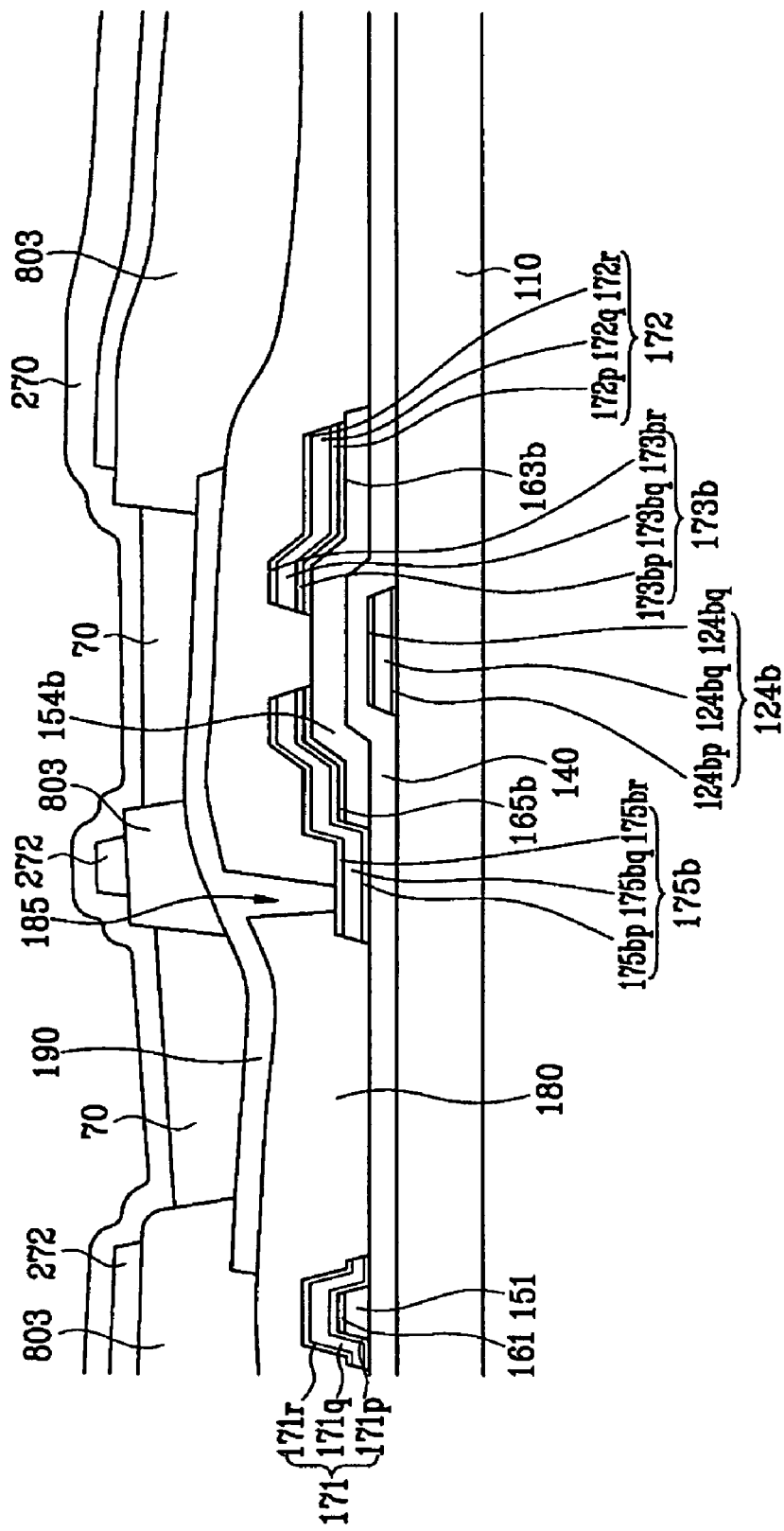

FIG. 7 is a layout view of a TFT array panel for an OLED according to another embodiment of the present invention. FIGS. 8A and 8B are sectional views of the TFT array panel shown in FIG. 7 taken along the line VIIIa-VIIIa' and the line VIIIb-VIIIb', respectively.

A plurality of gate conductors that include a plurality of gate lines 121, including a plurality of first gate electrodes 124a and a plurality of second gate electrodes 124b, are formed on an insulating substrate 110 such as transparent glass.

The gate lines 121 transmitting gate signals extend substantially in a transverse direction (with respect to FIG. 7) and are separated from each other. The first gate electrodes 124a protrude upward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

Each of the second gate electrodes 124b is separated from the gate lines 121 and includes a storage electrode 133 extending substantially in a transverse direction between two adjacent gate lines 121.

The gate lines 121, the first and second gate electrodes 124a and 124b, and the storage electrodes 133 have first layers 124ap, 124bp, and 133p, second layers 124aq, 124bq, and 133q formed on the first layers 124ap, 124bp, and 133p, and third layers 124ar, 124br, 133r formed on the second layers 124aq, 124bq, and 133q. The first layers 124ap, 124bp, and 133p are made of a conductive oxide such as ITO or IZO. The second layers 124aq, 124bq, and 133q are made of an Ag-containing metal such as Ag itself or an Ag alloy. The third layers 124ar, 124br, 133 are made of a conductive oxide such as ITO or IZO.

When a conductive oxide layer is disposed between an Ag layer and a substrate, adhesiveness between the Ag layer and the substrate is enhanced to prevent the Ag layer from peeling and lifting.

When a conductive oxide layer is deposited at a temperature less than 150° C., the conductive oxide layer has an amorphous state. An amorphous ITO layer has high surface roughness. That is, an amorphous ITO layer has highly uneven surfaces, which increase the contact area between the amorphous ITO layer and the underlying substrate as well as the contact area between the amorphous ITO layer and the upper Ag layer. Increased contact area enhances adhesiveness. Furthermore, the amorphous ITO layer formed at a low temperature undergoes a high temperature treatment at about 200° C. to 400° C. to be crystallized while forming the gate insulating layer 140 and a semiconductor layer 151. The crystallization of the ITO layer enhances adhesiveness between the substrate 110 and the second conductive layers 124aq, 124bq, and 133q.

The first layers 124ap, 124bp, and 133p and the third layers 124ar, 124br, and 133r may be formed of an ITON layer to prevent oxidation of Ag at the interfaces of the second layers 124aq, 124bq, and 133q, the first layers 124ap, 124bp, and 133p, and the third layers 124ar, 124br, and 133r. The ITON layer, which is formed by exposing the ITO layer to a nitrogen atmosphere, prevents a rapid increase of resistance due to Ag oxidation.

The third layers 124ar, 124br, and 133r of a conductive oxide on the second layers 124aq, 124bq, and 133q of Ag prevents Ag from diffusing into a gate insulating layer 140 which will be formed thereon.

An Ag layer and an amorphous ITO layer can be etched by the same etching condition. Since Ag is etched fast with an acid, a weak acid is generally used to etch an Ag layer. Since the amorphous ITO has many dangling bonds, the amorphous ITO is etched by a weak acid. Accordingly, the amorphous ITO can be etched along with the Ag layer by the same etchant.

FIG. 23A illustrates a profile of triple-layered structure including an amorphous ITO, an Ag layer, and another amorphous ITO. The three layers are simultaneously etched with an etchant. FIG. 23A shows that the simultaneous etching with an etchant results in a good profile.

The lateral sides of the gate conductors 124a and 124b are inclined relative to a surface of the substrate 110, and the incline angle thereof ranges from about 30 to about 80 degrees.

A gate insulating layer 140, preferably made of silicon nitride (SiNx), is formed on the gate conductors 124a and 124b.

A plurality of semiconductor stripes 151 and islands 154b, preferably made of hydrogenated amorphous silicon (abbreviated to "a-Si") or polysilicon, are formed on the gate insulating layer 140. Each semiconductor stripe 151 extends substantially in the longitudinal direction and has a plurality of projections 154a branching out toward the first gate electrodes 124a. Each semiconductor island 154b crosses a second gate electrode 124b and includes a portion 157 overlapping the storage electrode 133 of the second gate electrode 124b.

A plurality of ohmic contact stripes 161 and ohmic contact islands 163b, 165a, and 165b, which are preferably made of silicide or n+ hydrogenated a-Si heavily doped with an n-type impurity such as phosphorous, are formed on the semiconductor stripes 151 and islands 154b. Each ohmic contact stripe 161 has a plurality of projections 163a, and the projections 163a and the ohmic contact islands 165a are located in pairs on the projections 154a of the semiconductor stripes 151. The ohmic contact islands 163b and 165b are located in pairs on the semiconductor islands 154b.

The lateral sides of the semiconductor stripes 151 and islands 154b and the ohmic contacts 161, 163b, 165b, and 165b are inclined relative to a surface of the substrate, and the incline angles thereof are preferably in a range between about 30 and about 80 degrees.

A plurality of data conductors including a plurality of data lines 171, a plurality of voltage transmission lines 172, and a plurality of first and second drain electrodes 175a and 175b are formed on the ohmic contacts 161, 163b, 165b, and 165b and the gate insulating layer 140.

The data lines 171 for transmitting data signals extend substantially in the longitudinal direction and intersect the gate lines 121. Each data line 171 includes a plurality of first source electrodes 173a, and an end portion having a large area for contact with another layer or an external device. The data lines 171 may be directly connected to a data driving circuit for generating the gate signals, which may be integrated on the substrate 110.

The voltage transmission lines 172 for transmitting driving voltages extend substantially in the longitudinal direction and intersect the gate lines 121. Each voltage transmission line 172 includes a plurality of second source electrodes 173b. The voltage transmission lines 172 may be connected to each other. The voltage transmission lines 172 overlap the storage region 157 of the semiconductor islands 154b.

The first and the second drain electrodes 175a and 175b are separated from the data lines 171 and the voltage transmission lines 172, and from each other. Each pair of the first source electrodes 173a and the first drain electrodes 175a are disposed opposite each other with respect to a first gate electrode 124a, and each pair of the second source electrodes 173b and the second drain electrodes 175b are disposed opposite each other with respect to a second gate electrode 124b.

A first gate electrode 124a, a first source electrode 173a, and a first drain electrode 175a, along with a projection 154a of a semiconductor stripe 151, form a switching TFT having a channel formed in the projection 154a disposed between the first source electrode 173a and the first drain electrode 175a. Meanwhile, a second gate electrode 124b, a second source electrode 173b, and a second drain electrode 175b, along with a semiconductor island 154b, form a driving TFT having a channel formed in the semiconductor island 154b disposed between the second source electrode 173b and the second drain electrode 175b.

The data conductors 171, 172, 175a, and 175b preferably have first layers 171p, 172p, 175ap, and 175bp, second layers 171q, 172q, 175aq, and 175bq, and third layers 171r, 172r, 175ar, and 175br. The second layers 171q, 172q, 175ap, and 175bp are made of an Ag-containing metal such as Ag or an Ag alloy. The first layers 171p, 172p, 175ap, and 175bp and third layers 171r, 172r, 175ar, and 175br are respectively disposed at lower and upper sides of the second layers 171q, 172q, 175aq, and 175bq. The first layers 171p, 172p, 175ap, and 175bp and the third layers 171r, 172r, 175ar, and 175br are made of a conductive oxide such as ITO or IZO.

The first layers 171p, 172p, 175ap, and 175bp and the third layers 171r, 172r, 175ar, and 175br may be made of ITO. The first layers 171p, 172p, 175ap, and 175bp and the third layers 171r, 172r, 175ar, and 175br of a conductive oxide prevent the Ag of the second layers 171q, 172q, 175aq, and 175bq from diffusing into the semiconductor layer 151 and a pixel electrode 190 formed thereon.

When the conductive oxide layer is made of ITO, amorphous ITO is preferable. Since the amorphous ITO or IZO is etched along with Ag by the same etchant, they are simultaneously patterned to form the data lines 171 having a good profile.

Since Ag is etched fast an acid, a weak acid is generally used to etch an Ag layer. Since the amorphous ITO has many dangling bonds, the amorphous ITO is also etched by a weak acid. Accordingly, the amorphous ITO can be etched along with the Ag layer by the same etchant.

The first layers 171p, 172p, 175ap, and 175bp and the third layers 171r, 172r, 175ar, and 175br is preferably formed of an ITON layer to prevent oxidation of Ag at the interface of the second layers 171q, 172q, 175aq, and 175bq and the first and third layers 171p, 172p, 175ap, 175bp, 171r, 172r, 175ar, and 175br. The ITON layer, which is formed by exposing the ITO layer to a nitrogen atmosphere, prevents a rapid increase of resistance from Ag oxidation.

Like the gate conductors 121 and 124b, the data conductors 171, 172, 175a, and 175b have tapered lateral sides relative to the surface of the substrate 110, and the incline angles thereof range from about 30 to 80 degrees.

The ohmic contacts 161,163b, 165b, and 167 are interposed between the underlying semiconductor stripes 151 and islands 154b and the overlying data conductors 171, 172, 175a, and 175b thereon, and reduce the contact resistance therebetween. The semiconductor stripes 151 include a plurality of exposed portions that are not covered with the data conductors 171, 172, 175a, and 175b.

Most of the semiconductor stripe 151 is narrower than the data line 171 but the width of the semiconductor stripe 151 broadens near a place where the semiconductor stripe 151 and the gate line 121 meet each other in order to prevent disconnection of the data line 171, as mentioned above.

A passivation layer 180 is formed on the data conductors 171, 172, 175a, and 175b and the exposed portions of the semiconductor stripes 151 and islands 154b. The passivation layer 180 is preferably made of an inorganic material such as silicon nitride or silicon oxide, a photosensitive organic material having good flatness characteristics, or a low dielectric insulating material having a dielectric constant lower than 4.0, such as a-Si:C:O and a-Si:O:F, formed by plasma enhanced chemical vapor deposition (PECVD). The passivation layer 180 may include a lower film of an inorganic insulator and an upper film of an organic insulator.

The passivation layer 180 has a plurality of contact holes 189,183, 185, 181, and 182 exposing portions of the first drain electrode 175a, a second gate electrode 124b, the second drain electrode 175b, and the end portions 129 and 179 of the gate line 121 and the data line 171, respectively.

The contact holes 181 and 182 expose the end portions 129 and 179 of the gate line 121 and the data line 171 to connect them with external driving circuits. Anisotropic conductive films are disposed between the output terminals of the external driving circuit and the end portions 129 and 175 to assist electrical connection and physical adhesion. However, when driving circuits are directly fabricated on the substrate 110, contact holes are not formed. When gate driving circuits are directly fabricated on the substrate 110 and data driving circuits are formed as separate chips, only contact hole 181 exposing the end portion 179 of the data line 171 is formed.

A plurality of pixel electrodes 190, a plurality of connecting members 192, and a plurality of contact assistants 81 and 82 are formed on the passivation layer 180.

The pixel electrodes 190 are connected to the second drain electrodes 175b through the contact holes 185. The connecting member 192 connects the first drain electrode 175a and the second gate electrode 124b through the contact holes 189 and 183. The contact assistants 81 and 82 are connected to the end portions 129 and 179 of the gate line 121 and the data line 171 through the contact holes 181 and 182, respectively.

The pixel electrode 190, the connecting member 192, and the contact assistants 81 and 82 are made of a transparent conductor such as ITO or IZO.

A partition 803, an auxiliary electrode 272, a plurality of light emitting members 70, and a common electrode 270 are formed on the passivation layer 180 and the pixel electrodes 190.

The partition 803 is made of an organic or inorganic insulating material and forms frames of organic light emitting cells. The partition 803 is formed along the boundaries of the pixel electrodes 190 and defines a space for filling with an organic light emitting material.

The light emitting member 70 is disposed on the pixel electrode 190 and surrounded by the partition 803. The light emitting member 70 is made of one light emitting material that emits red, green, or blue light. Red, green, and blue light emitting members 70 are sequentially and repeatedly disposed.

The auxiliary electrode 272 has substantially the same planar pattern with the partition 803. The auxiliary electrode 272 contacts the common electrode 270 to reduce the resistance of the common electrode 270.

The common electrode 270 is formed on the partition 803, the auxiliary electrode 272, and the light emitting member 70. The common electrode 270 is made of a metal such as Al, which has low resistivity. This embodiment illustrates a back-emitting OLED. However, when a front-emitting OLED or dual-side-emitting OLED is considered, the common electrode 270 is made of a transparent conductor such as ITO or IZO.

A method of manufacturing the TFT array panel shown in FIGS. 7 to 8B according to an embodiment of the present invention will be now described in detail with reference to FIGS. 9A to 22B as well as FIGS. 7 to 8B.

FIGS. 9, 11, 13, 15, 17, 19, and 21 are layout views of the TFT array panel shown in FIGS. 7 to 8B in intermediate steps of a manufacturing method according to an embodiment of the present invention. FIGS. 10A and 10B are sectional views of the TFT array panel shown in FIG. 9 taken along the lines Xa-Xa' and Xb-Xb', respectively. FIGS. 12A and 12B are sectional views of the TFT array panel shown in FIG. 11 taken along the lines XIIa-XIIa' and XIIb-XIIb', respectively. FIGS. 14A and 14B are sectional views of the TFT array panel shown in FIG. 13 taken along the lines XIVa-XIVa' and XIVb-XIVb'. FIGS. 16A and 16B are sectional views of the TFT array panel shown in FIG. 15 taken along the lines XVIa-XVIa' and XVIb-XVIb', respectively. FIGS. 18A and 18B are sectional views of the TFT array panel shown in FIG. 17 taken along the lines XVIIIa-XVIIIa' and XVIIIb-XVIIIb', respectively. FIGS. 20A and 20B are sectional views of the TFT array panel shown in FIG. 19 taken along the lines XXa-XXa' and XXb-XXb', respectively. FIGS. 22A and 22B are sectional views of the TFT array panel shown in FIG. 21 taken along the lines XXIIa-XXIIa' and XXIIb-XXIIb'.

Figure 9:
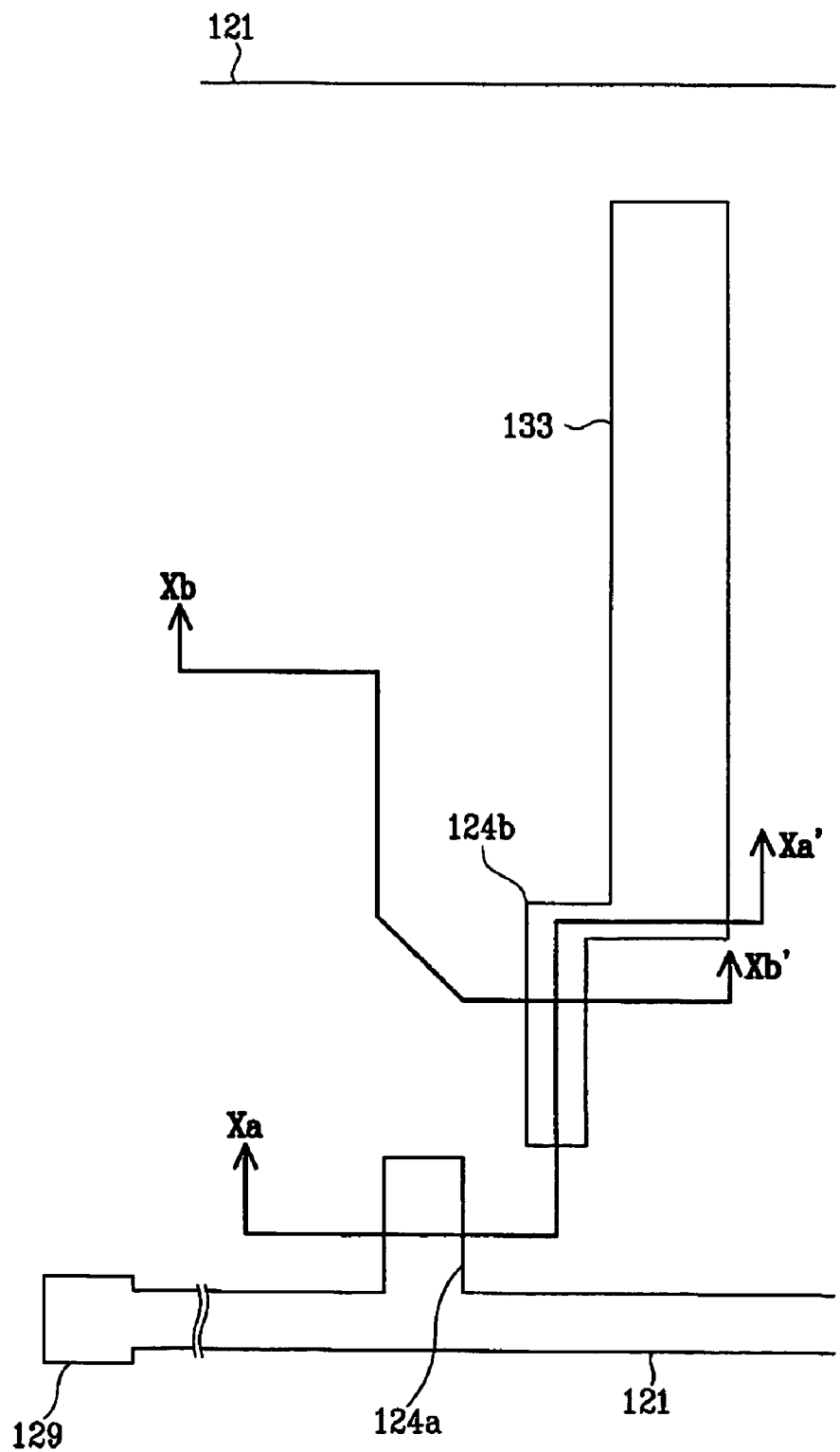
FIGS. 9, 11, 13, 15, 17, 19, and 21 are layout views of the TFT array panel shown in FIGS. 7 to 8B in intermediate steps of a manufacturing method according to an embodiment of the present invention.
Figure 10B:
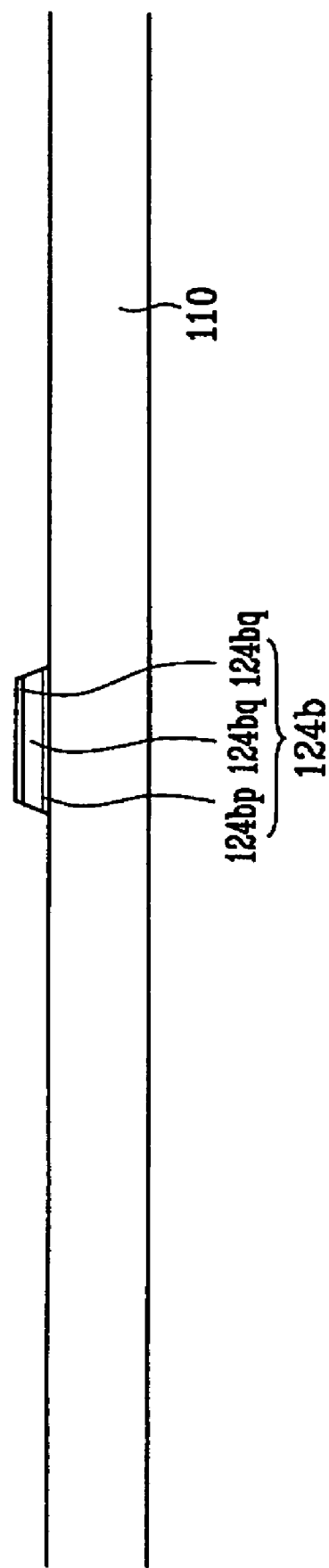

At first, as shown in FIGS. 9 and 10B, a first layer of a conductive oxide such as ITO or IZO, a second layer of Ag-containing metal and a third layer of a conductive oxide such as ITO or IZO are formed on an insulating substrate 110.

The first layer and the second layer are deposited by co-sputtering. Two targets are installed in a same sputtering chamber for the co-sputtering. One target is made of a conductive oxide such as ITO or IZO. The other target is made of a Ag-containing metal such as Ag or an Ag alloy. Hereinafter, an exemplary embodiment using an ITO target and an Ag target will be described.

The co-sputtering is performed as follows.

At first, power is applied only to the ITO target and not to the Ag target to deposit a first ITO layer. The sputtering is performed at a temperature less than 150° C., preferably at room temperature, while applying hydrogen gas ($H_2$) or water vapor ($H_2O$). Such condition causes the ITO layer to be amorphous. The ITO layer has a thickness of about 30 Å to about 300 Å.

Here, nitrogen gas ($N_2$), nitrous oxide ($N_2O$), or ammonia ($NH_3$) may be applied during sputtering the ITO target to form an ITON layer.

Next, power is switched to be applied only to the Ag target and not to the ITO target to deposit an Ag layer. The Ag layer has a thickness of about 1,000 Å to about 3,000 Å.

Next, power is switched back to the ITO target and cut off from the Ag target to deposit a second ITO layer. The sputtering is performed at a temperature less than 150° C., preferably at room temperature, while applying hydrogen gas ($H_2$) or water vapor ($H_2O$). Such condition causes the ITO layer to be amorphous. The ITO layer has a thickness of about 30 Å to about 300 Å.

When the ITO layers have a thickness less than about 30 Å, the Ag layer may directly contact the substrate 110 and degrade adhesiveness. When the ITO layers have a thickness thicker than about 300 Å, it may induce bad ohmic contact with other conductive layers.

Here, nitrogen gas ($N_2$), nitrous oxide ($N_2O$), or ammonia ($NH_3$) may be applied during the sputtering of the ITO target to form an ITON layer.

When a conductive oxide layer is disposed between an Ag layer and a substrate 110, adhesiveness between the Ag layer and the substrate 110 is enhanced to prevent peeling and lifting of the Ag layer.

When the conductive oxide layer is deposited at a temperature less than 150° C., an amorphous ITO layer having dangling bonds is formed. Accordingly, adhesiveness between the Ag layer and the substrate 110 is particularly enhanced. An amorphous ITO layer has a high surface roughness. That is, an amorphous ITO layer has highly uneven surfaces, which increase contact areas between the amorphous ITO layer and the underlying substrate and the upper Ag layer to enhance their adhesiveness. Furthermore, the amorphous ITO layer formed at a low temperature undergoes a high temperature treatment at about 200 to about 400° C. to be crystallized while forming the gate insulating layer 140 and a semiconductor layer 151.

The amorphous ITO layer prevents diffusion of Ag to other layers.

When nitrogen gas ($N_2$), nitrous oxide ($N_2O$), or ammonia ($NH_3$) is applied during sputtering the ITO or IZO target, an ITON or IZON layer is formed to prevent oxidation of the Ag layer at the interface.

As in the above descriptions, when an amorphous ITO or IZO layer is disposed between an Ag layer and a substrate, adhesiveness between the Ag layer and the substrate is enhanced, as well as the etching efficiency.

Then, photoresist is coated on the second ITO layer and is illuminated with a light through a photo-mask. The illuminated photoresist is then developed.

The two ITO layers and the Ag layer are simultaneously etched to form a plurality of gate lines 121, the second gate electrode 124b, and the voltage transmission line 172 with an etchant. The etchant may be one of hydrogen peroxide ($H_2O_2$) or a common etchant containing an appropriate amount of phosphoric acid ($H_2PO_3$), nitric acid ($HNO_3$), and acetic acid ($CH_3COOH$).

Figure 11:
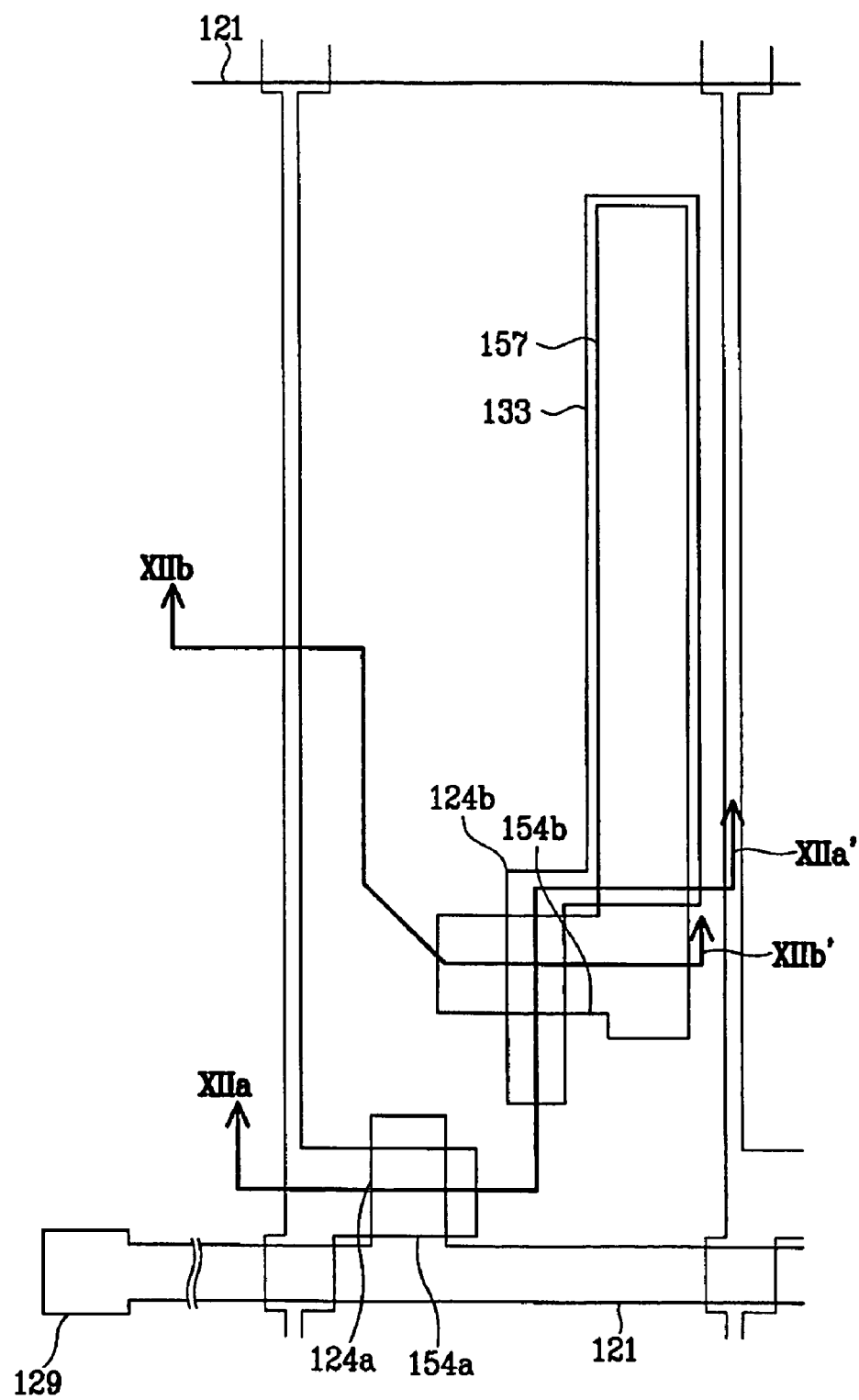
Figure 12A:
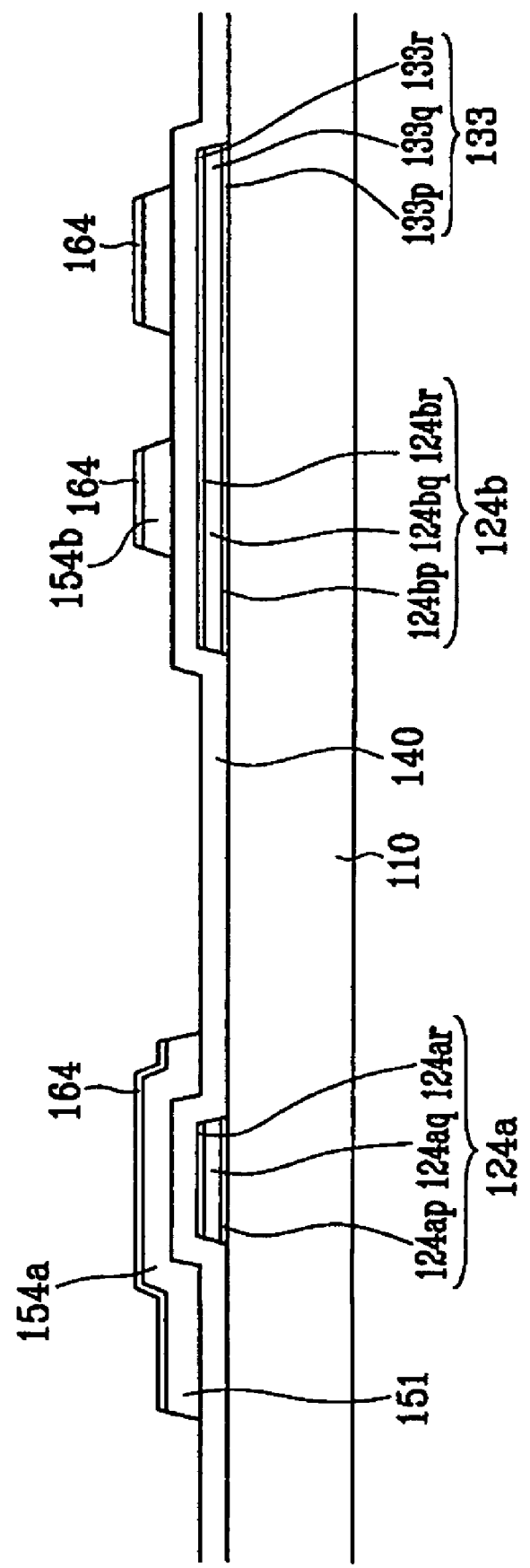
FIGS. 12A and 12B are sectional views of the TFT array panel shown in FIG. 11 taken along the lines XIIa-XIIa' and XIIb-XIIb', respectively.
Figure 12B:
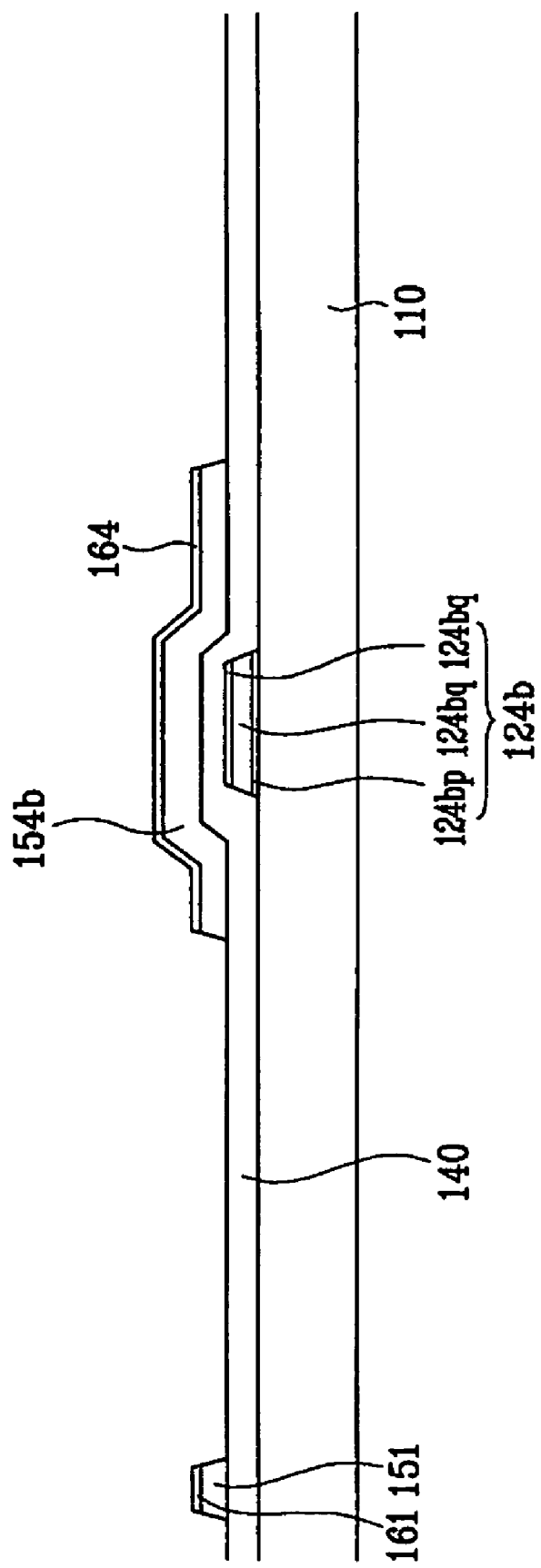

Referring to FIGS. 11-12B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 and islands 154b including projections 154a on the gate insulating layer 140. Since these processes are performed at high temperatures over 200° C., the amorphous ITO of the gate line 121 is crystallized to enhance adhesiveness.

FIG. 23B illustrates a profile of a gate line after depositing the gate insulating layer 140, the intrinsic amorphous silicon, and the extrinsic amorphous silicon. FIG. 23B shows that the gate line 121 maintains a good profile without lifting or peeling.

Figure 13:
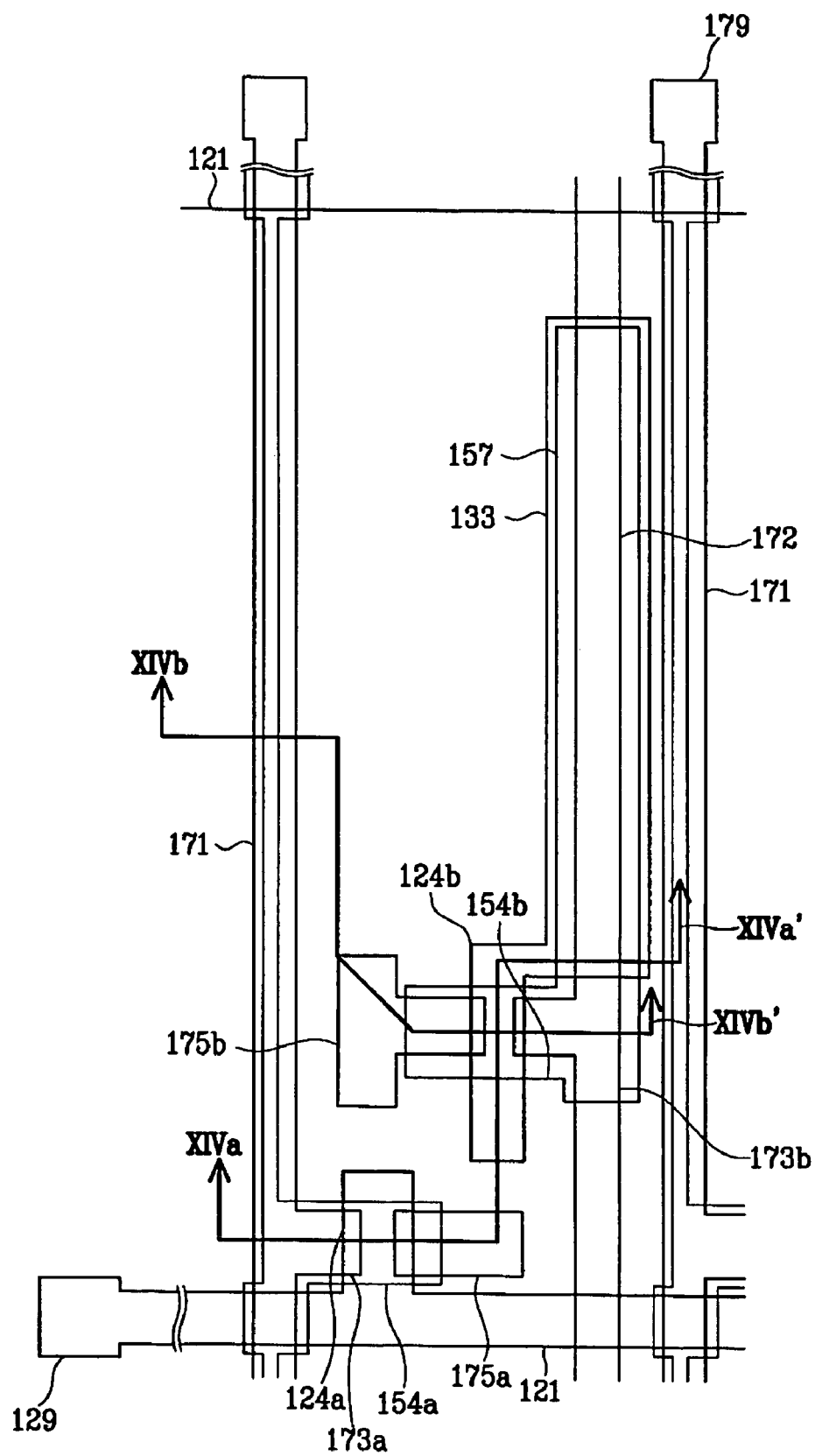
Figure 14A:
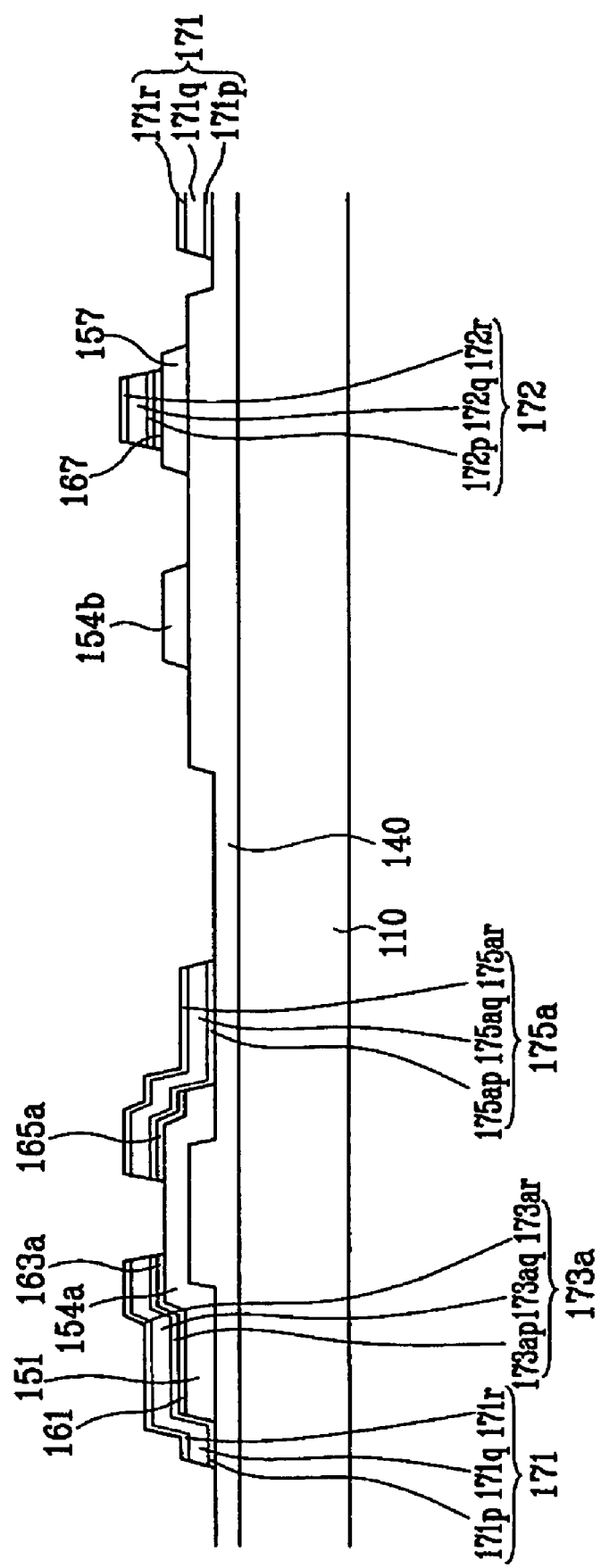
FIGS. 14A and 14B are sectional views of the TFT array panel shown in FIG. 13 taken along the lines XIVa-XIVa' and XIVb-XIVb', respectively.
Figure 14B:
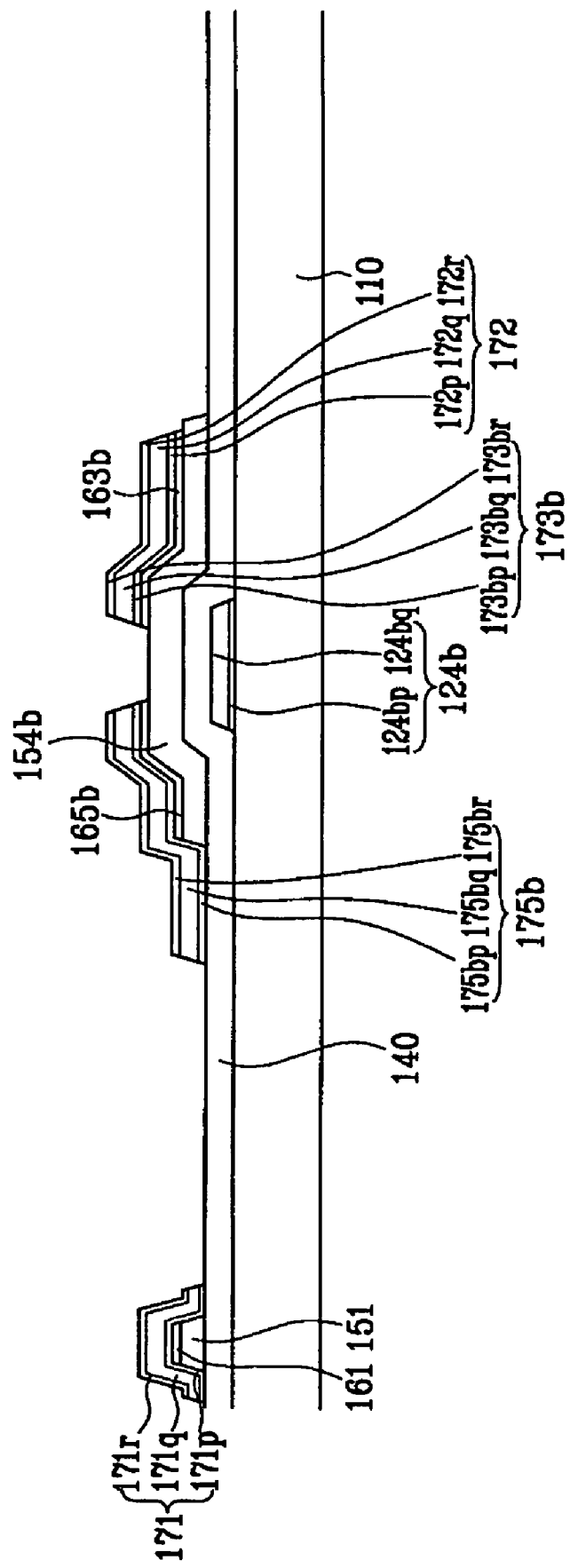

Next, referring to FIGS. 13 to 14B, a first layer of a conductive oxide such as ITO, a second layer of an Ag-containing metal, and a third layer of a conductive oxide such as ITO are sequentially deposited on the extrinsic semiconductor stripes 161. The first and third layers have a thickness of about 30 to about 300 Å and the second layer has a thickness of about 1,000 to 3,000 Å.

The first layer and the third layer of a conductive oxide prevent the Ag of the second layer from diffusing into the semiconductor layer 151 and a pixel electrode 190 which will be formed thereon.

When the first layer and the third layer are formed of ITO, the sputtering is preferably performed at a temperature less than 150° C. while applying hydrogen gas ($H_2$) or water vapor ($H_2O$). Such condition causes the ITO layer to be amorphous. An ITO layer formed at a temperature less than 150° C. has an amorphous state.

Since the amorphous ITO has many dangling bonds, the amorphous ITO is highly reactive to an acid. Accordingly, the amorphous ITO is etched with a weak acid. Since the amorphous ITO can be etched along with the Ag layer by a weak acid, they can be simultaneously patterned.

When nitrogen gas ($N_2$), nitrous oxide ($N_2O$), or ammonia ($NH_3$) is applied while sputtering the ITO target, an ITON layer is formed instead of the ITO layer to prevent oxidation of the Ag layer at the interface.

Here, the ITO layer has a thickness of about 30 to about 300 Å. When the ITO layer has a thickness less than 30 Å, the Ag layer may directly contact the substrate 110 to degrade adhesiveness. When the ITO layer has a thickness greater than about 300 Å, it may induce bad ohmic contact with other conductive layers.

Then, photoresist is coated on the third layer and is illuminated with light through a photo-mask. The illuminated photoresist is then developed.

The first to third layers are simultaneously etched to form a plurality of data lines 171 with an etchant. The etchant may be one of hydrogen peroxide ($H_2O_2$) or a common etchant containing an appropriate amount of phosphoric acid ($H_2PO_3$), nitric acid ($HNO_3$), and acetic acid ($CH_3COOH$).

Through the above-described processes, as shown in FIGS. 13 to 14B, a plurality of data lines 171 having a plurality of first source electrodes 173a, a plurality of first and second drain electrodes 175a and 175b, and a plurality of voltage transmission lines 172 having second source electrodes 173b are formed.

Before or after removing the photoresist, portions of the extrinsic semiconductor stripes 164, which are not covered with the data conductors 171, 172, 175a, and 175b, are removed by etching to complete a plurality of ohmic contact stripes 161 including projections 163a and a plurality of ohmic contact islands 163b, 165a, and 165b, and to expose portions of the intrinsic semiconductor stripes 151 and islands 154b.

Oxygen plasma treatment may follow thereafter in order to stabilize the exposed surfaces of the semiconductor stripes 151.

Figure 15:
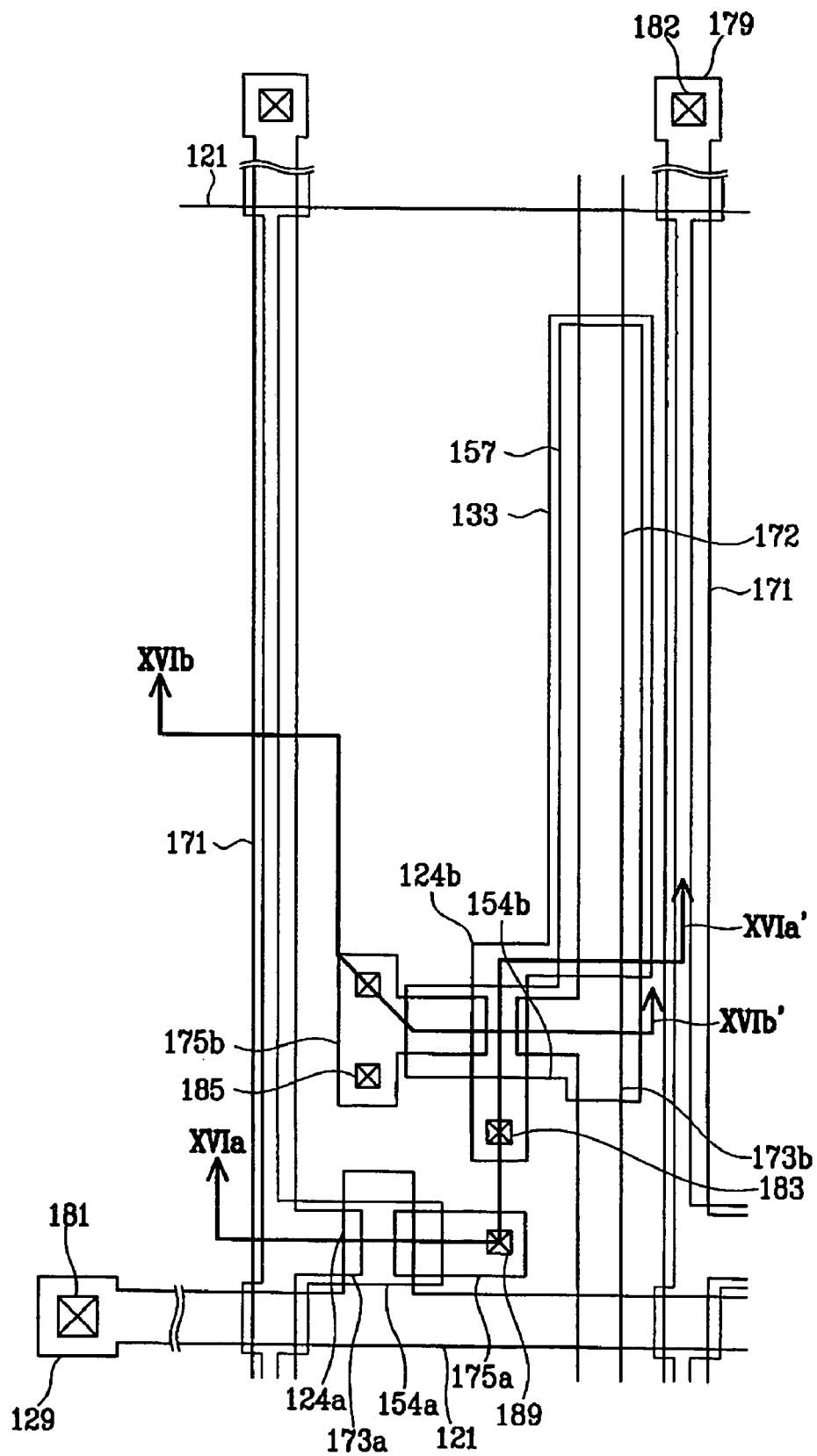
Figure 16B:
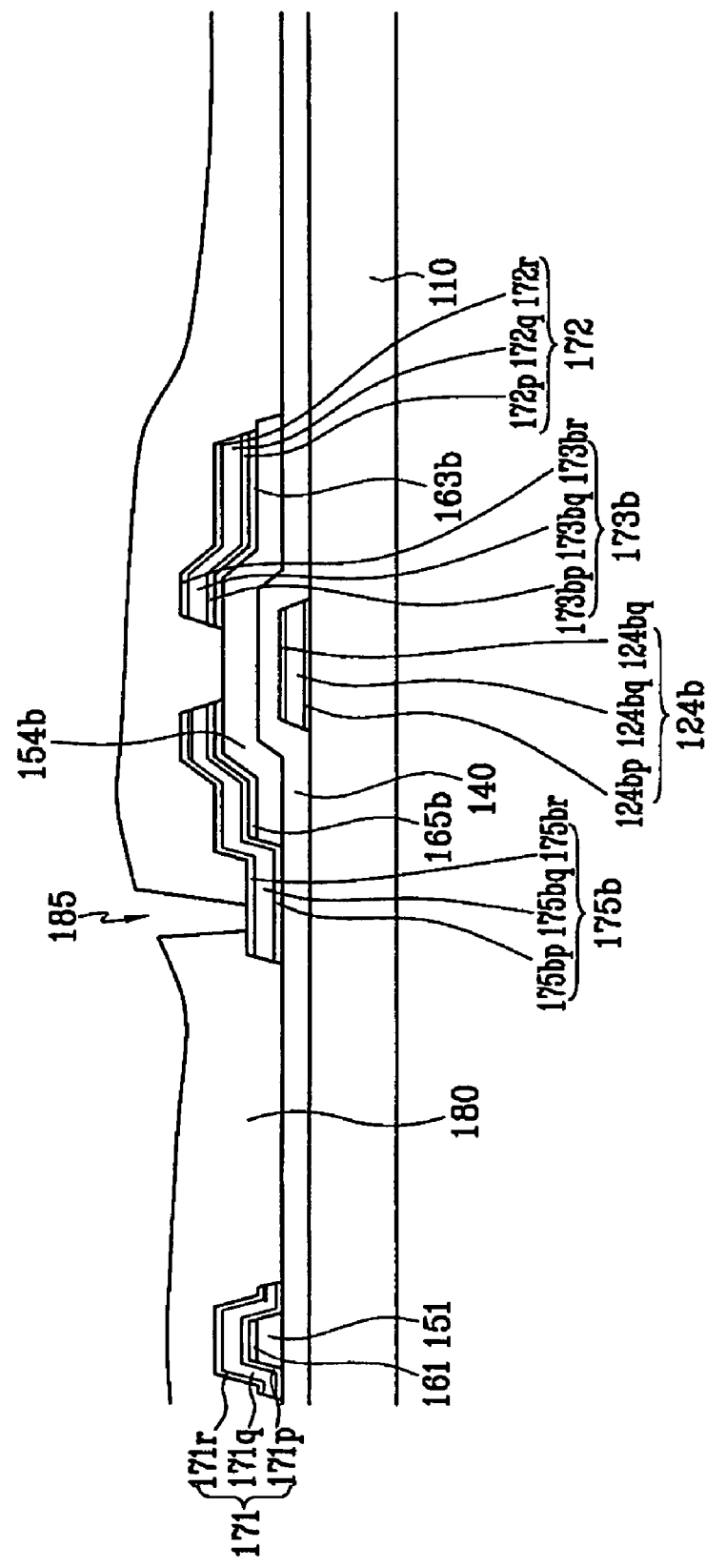

Referring to FIGS. 15 to 16B, a passivation layer 180 is formed of an organic insulating material or an inorganic insulating material. Since this process is performed at a high temperature of over 200° C., the amorphous ITO of the data conductors 171, 172, 175a, and 175b is crystallized.

FIG. 23C illustrates a gate line after forming the passivation 180. FIG. 23B shows that the data line 171 maintains a good profile without lifting or peeling.

The passivation layer 180 is patterned to form a plurality of contact holes 189, 185, 183, 181, and 182 exposing the first and second drain electrodes 175a and 175b, the second gate electrodes 124b, an end portion 129 of the gate line 121, and an end portion 179 of the data line 171.

Figure 17:
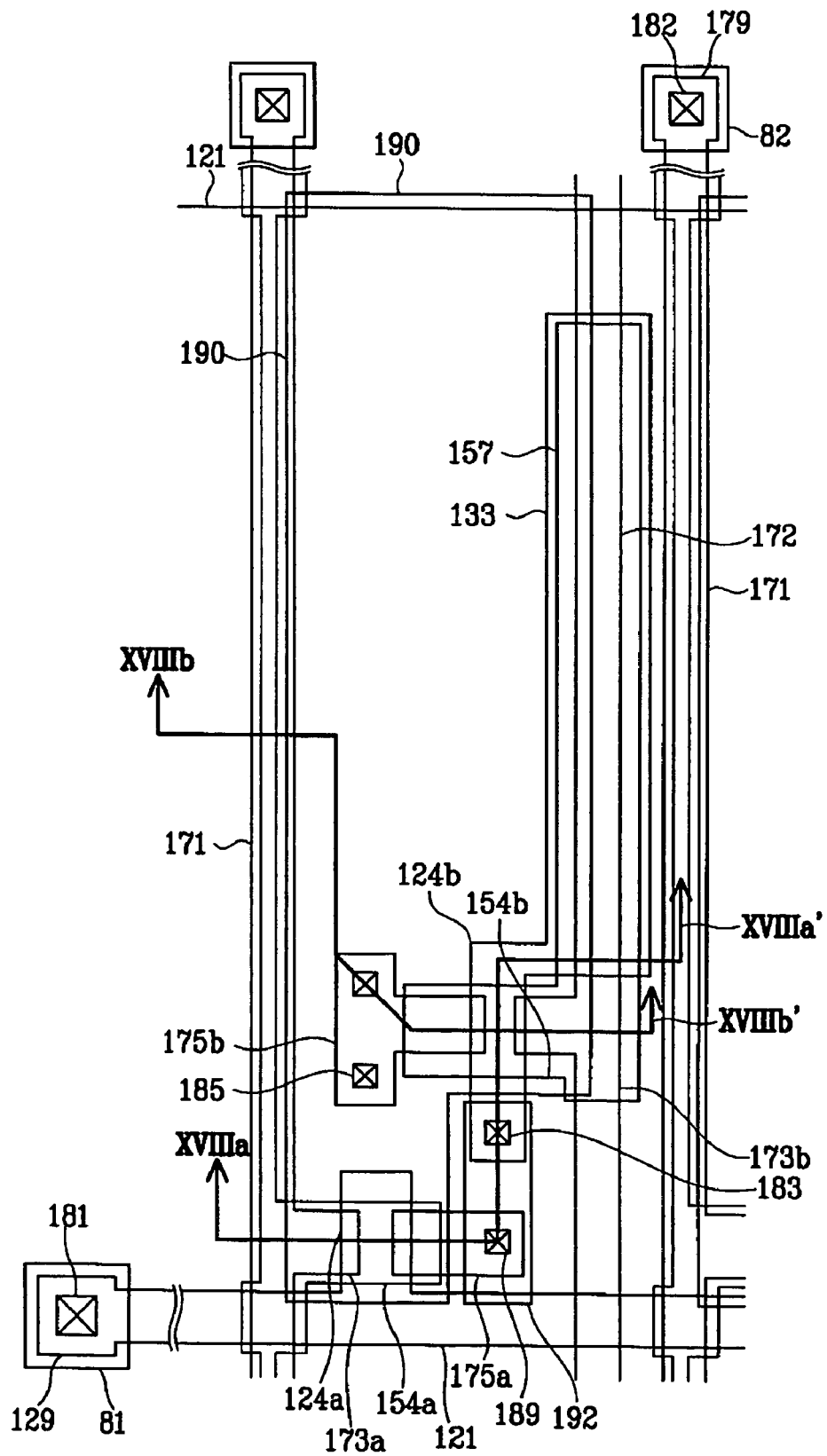
Figure 18A:
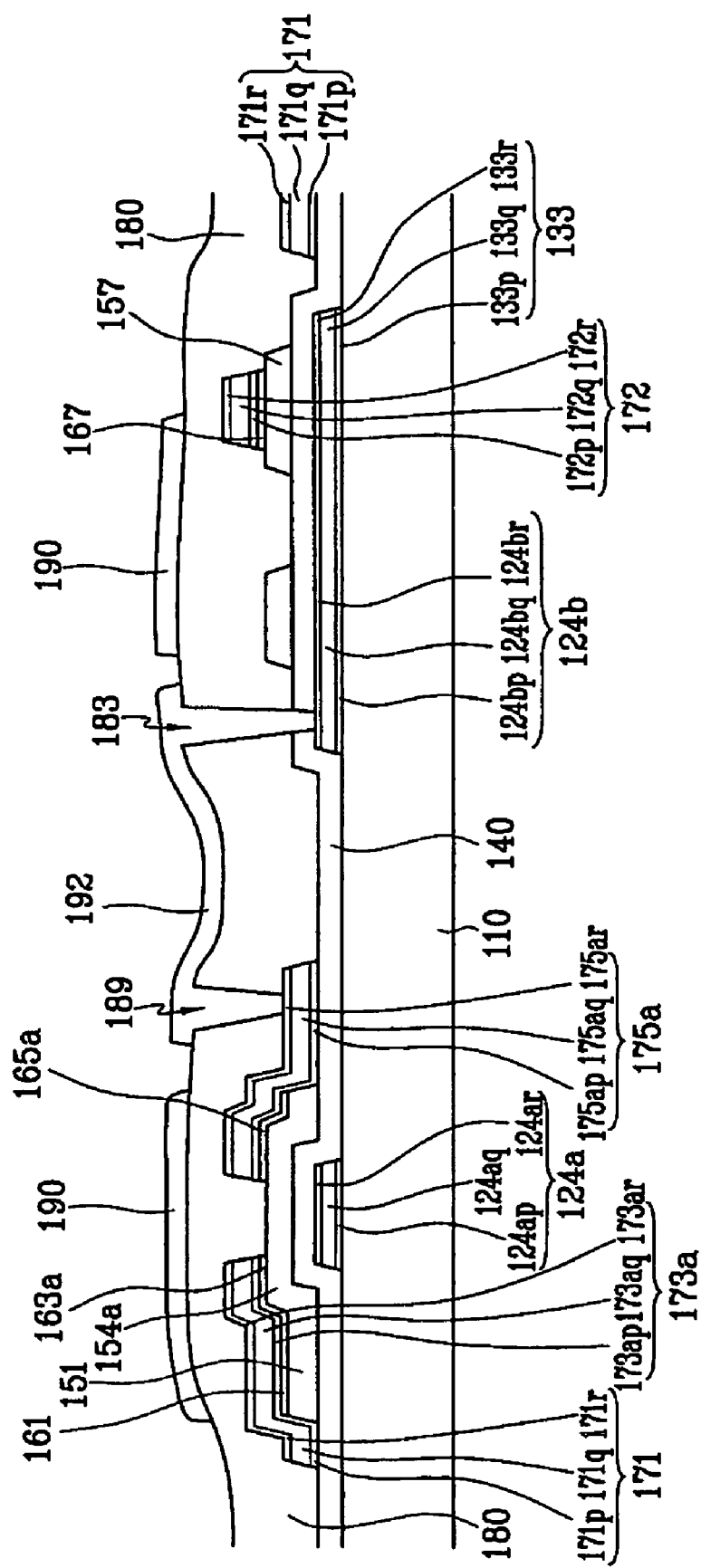
FIGS. 18A and 18B are sectional views of the TFT array panel shown in FIG. 17 taken along the lines XVIIIa-XVIIIa' and XVIIIb-XVIIIb', respectively.
Figure 18B:
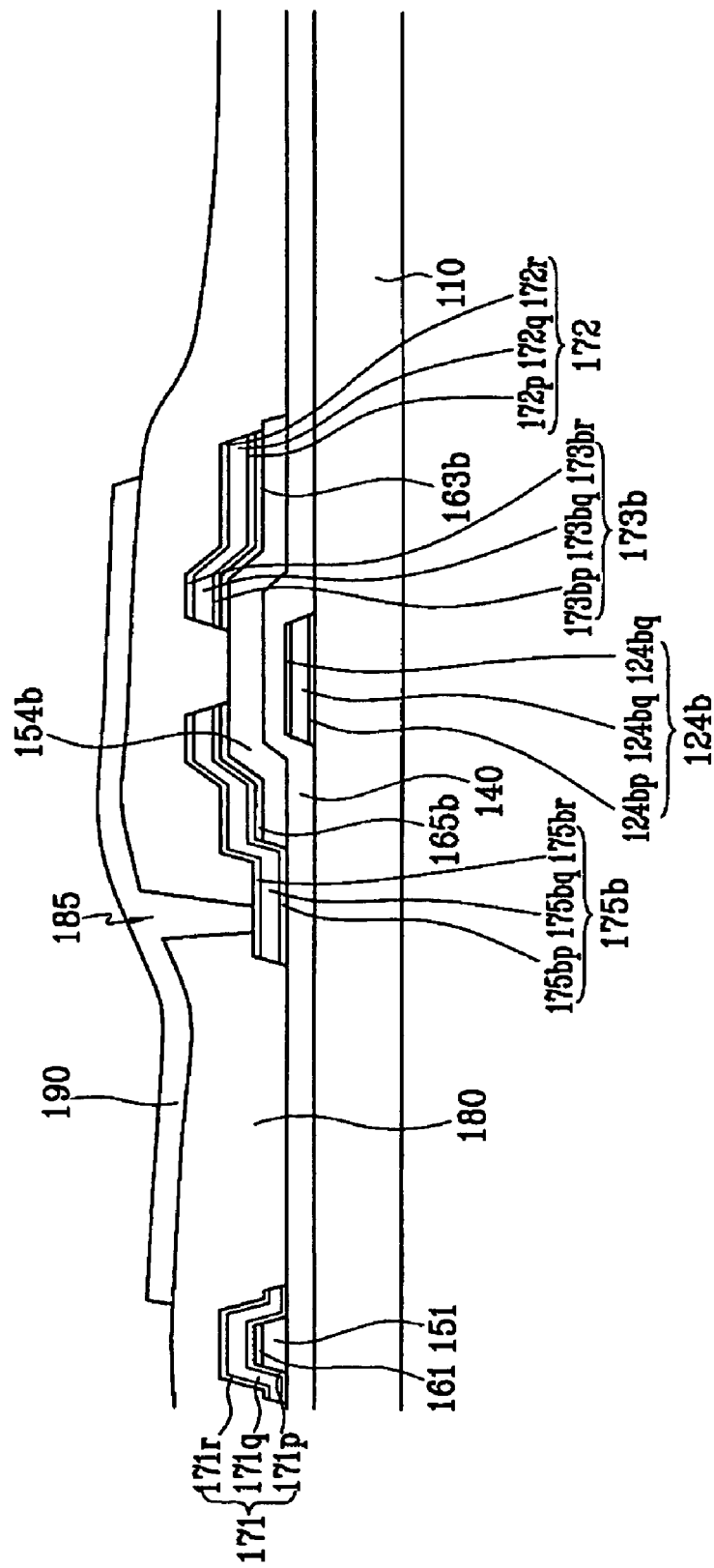

Referring to FIGS. 17 to 18B, a plurality of pixel electrodes 190, a plurality of connecting members 192, and contact assistants 81 and 82 are formed on the passivation layer 180 with ITO or IZO.

Figure 19:
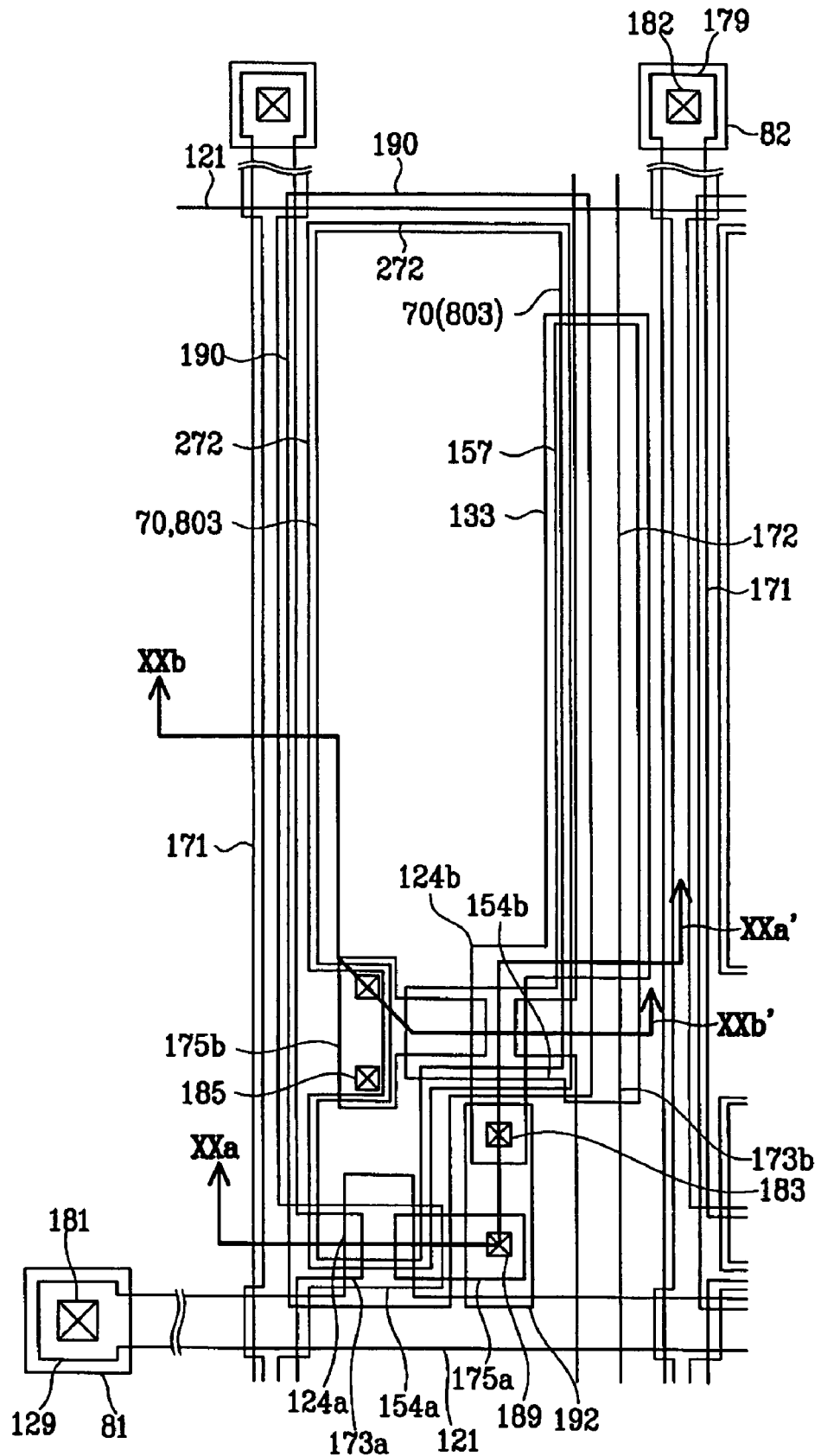
Figure 20A:
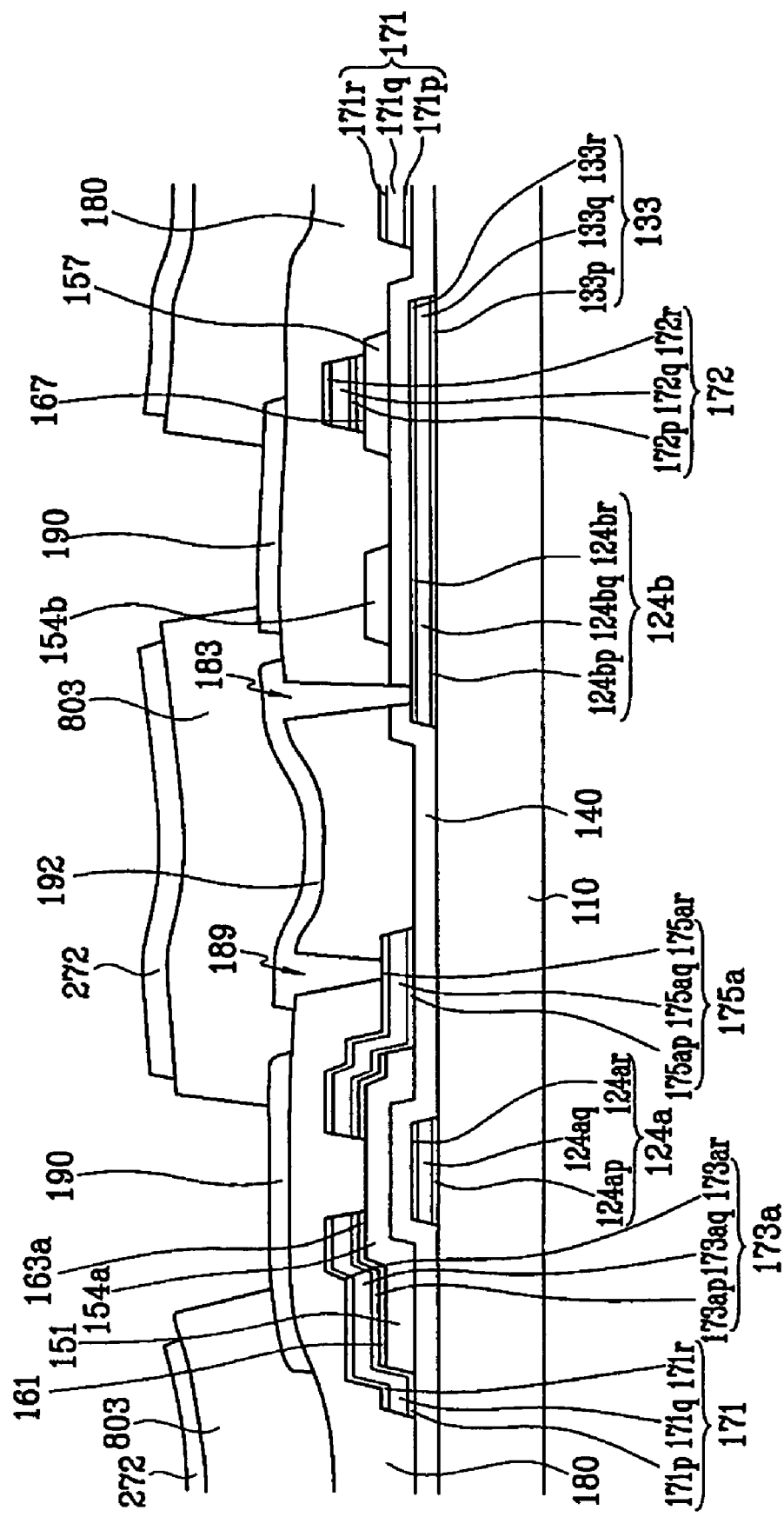

Referring to FIGS. 19-20B, a partition 803 and an auxiliary electrode 272 are formed in a single photolithographic step.

Figure 21:
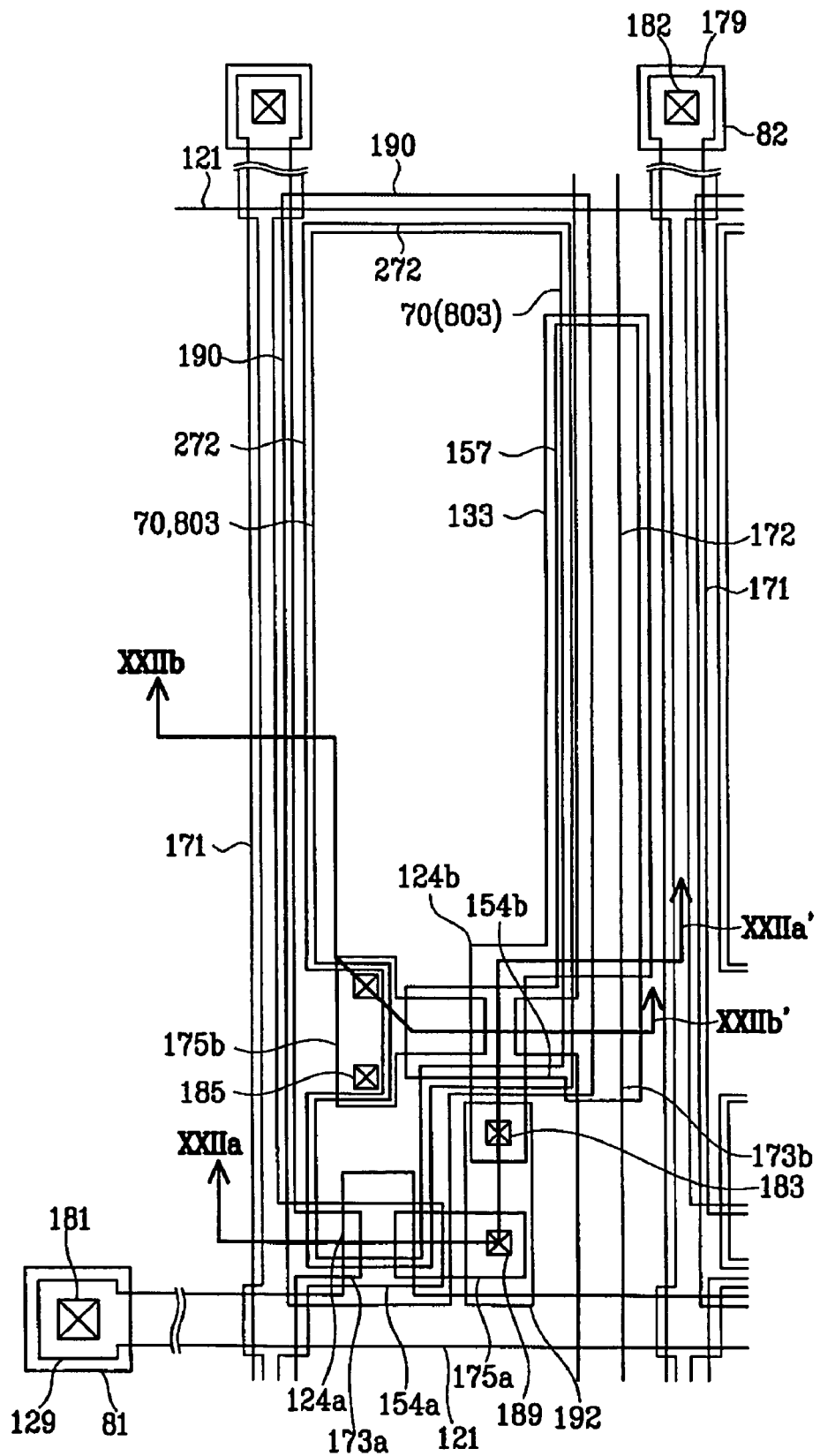
Figure 22A:
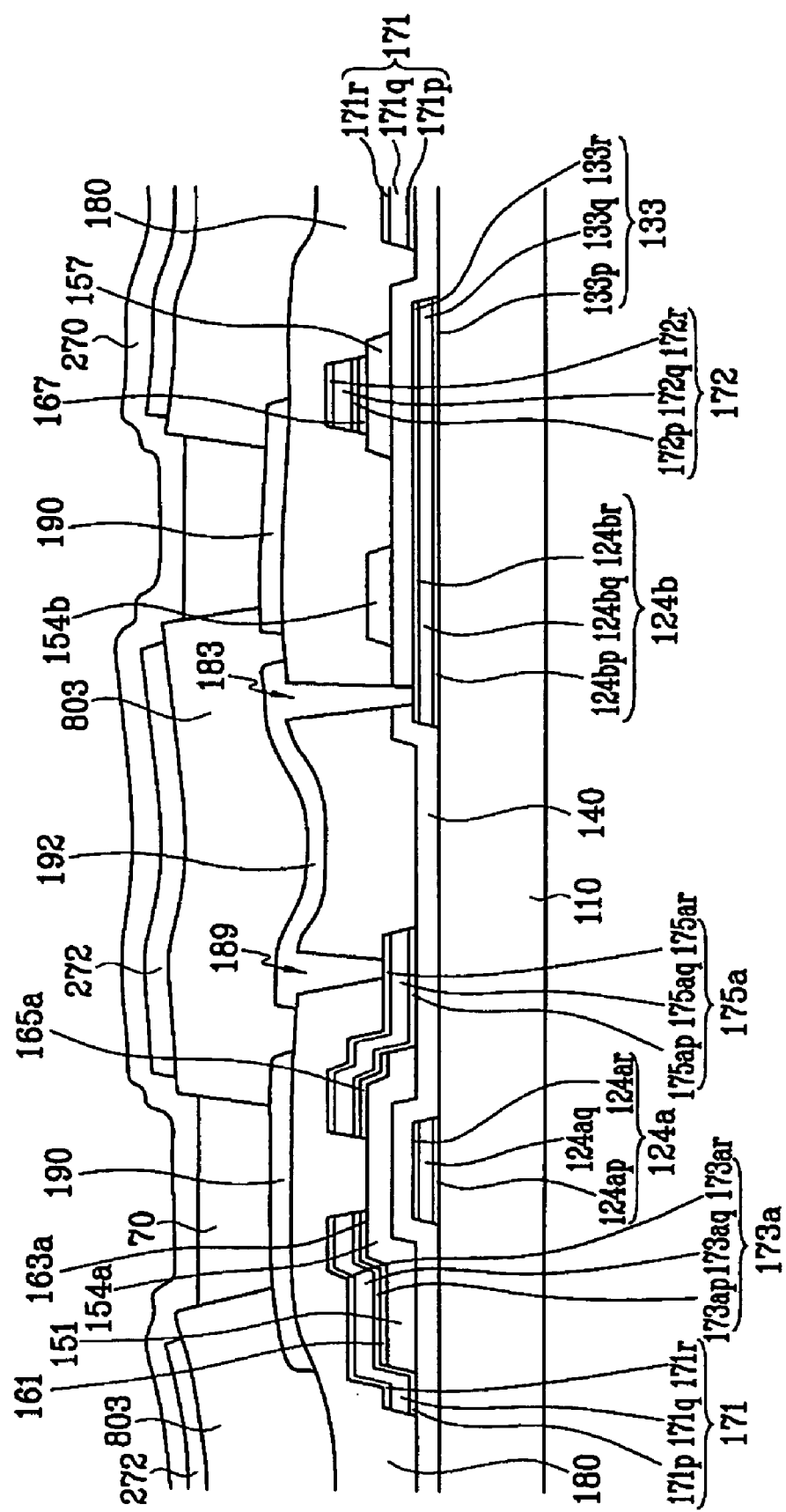

Finally, a plurality of organic light emitting members 70, preferably including multiple layers, are formed in the openings by deposition or inkjet printing following masking, and a common electrode 270 is subsequently formed as shown in FIGS. 21-22B.

In the present embodiment, ITO is used as the primary conductive oxide. However, this is not a limitation of the invention and another conductive oxide such as IZO may be applied as a conductive oxide in other embodiments.

In the present embodiment, both gate lines and data lines have triple-layered structures including a conductive oxide layer, an Ag layer, and another conductive oxide layer. However, this is not a limitation of the invention and only one of the gate lines and the data lines may have a triple-layered structure in other embodiments.

In the present embodiment, conductive oxide layers are disposed at a lower and upper sides of an Ag layer. However, one of the upper and lower conductive oxides may be omitted in other embodiments.

In the present invention, because a conductive oxide layer is disposed between an Ag layer and a substrate, adhesiveness between the Ag layer and the substrate and etching efficiency are enhanced. The conductive oxide layer prevents diffusion of Ag to another layer, enhancing the reliability of signal lines. Furthermore, the conductive oxide layer can be simultaneously etched along with the Ag layer. Thus, the method of manufacturing a TFT array panel is simplified.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A signal line for a display device comprising:
   a signal line having:
      a first conductive layer;
      a second conductive layer formed on the first conductive layer and containing Ag; and
      a third conductive layer formed on the second conductive layer;
   wherein the first conductive layer and the third conductive layer comprise a nitrogenated conductive oxide.

2. The signal line for a display device of claim 1, wherein the first conductive layer and the third conductive layer comprise an ITON or IZON.

3. The signal line for a display device of claim 2, wherein the first conductive oxide and the third conductive oxide are in a crystallized state.

4. A thin film transistor array panel comprising:
   an insulating substrate;
   a gate line formed on the insulating substrate;
   a gate insulating layer formed on the gate line;
   a drain electrode and a data line having a source electrode formed on the gate insulating layer, the drain electrode facing the source electrode with a gap therebetween; and
   a pixel electrode connected to the drain electrode,
   wherein at least one of the gate line, the data line, and the drain electrode includes a first conductive layer, second conductive layer formed on the first conductive layer and containing Ag, and a third conductive layer deposited on the second conductive layer;
   wherein the second conductive layer is thicker than the first conductive layer and the third conductive layer; and
   wherein the first conductive layer and the third conductive layer are made of a conductive oxide.

5. The thin film transistor array panel of claim 4, wherein the first conductive layer and the third conductive layer are made of an indium oxide.

6. The thin film transistor array panel of claim 5, wherein the indium oxide is one of ITO or IZO.

7. The thin film transistor array panel of claim 6, wherein the indium oxide is one of ITON or IZON.

8. The thin film transistor array panel of claim 4, wherein the first conductive layer and the third conductive layer are in a crystallized state.

9. The thin film transistor array panel of claim 4, wherein the first conductive layer and the third conductive layer have a thickness of about 30 to about 300 Å.

10. The thin film transistor array panel of claim 9, wherein the second conductive layer has a thickness of about 1,000 to about 3,000 Å.

* * * * *